(12) United States Patent
Verenchikov

(10) Patent No.: US 11,295,944 B2
(45) Date of Patent: *Apr. 5, 2022

(54) PRINTED CIRCUIT ION MIRROR WITH COMPENSATION

(71) Applicant: Micromass UK Limited, Wilmslow (GB)

(72) Inventor: Anatoly Verenchikov, Bar (ME)

(73) Assignee: MICROMASS UK LIMITED, Wilmslow (GB)

( * ) Notice: Subject to any disclaimer, the term of this patent is extended or adjusted under 35 U.S.C. 154(b) by 132 days.

This patent is subject to a terminal disclaimer.

(21) Appl. No.: 16/636,936

(22) PCT Filed: Jul. 26, 2018

(86) PCT No.: PCT/GB2018/052102
§ 371 (c)(1),
(2) Date: Feb. 6, 2020

(87) PCT Pub. No.: WO2019/030474
PCT Pub. Date: Feb. 14, 2019

(65) Prior Publication Data
US 2020/0373142 A1 Nov. 26, 2020

(30) Foreign Application Priority Data

Aug. 6, 2017 (GB) .................... 1712612
Aug. 6, 2017 (GB) .................... 1712613
(Continued)

(51) Int. Cl.
*H01J 49/40* (2006.01)
*H05K 1/02* (2006.01)

(52) U.S. Cl.
CPC .......... *H01J 49/405* (2013.01); *H01J 49/406* (2013.01); *H05K 1/0225* (2013.01); *H05K 2201/09063* (2013.01)

(58) Field of Classification Search
CPC ........ H01J 49/06; H01J 49/068; H01J 49/405; H01J 49/406; H05K 1/0225; H05K 2201/09063
See application file for complete search history.

(56) References Cited

U.S. PATENT DOCUMENTS 3,898,452 A 8/1975 Hertel
4,390,784 A 6/1983 Browning et al.
(Continued)

FOREIGN PATENT DOCUMENTS

CA 2412657 C 5/2003
CN 101369510 A 2/2009
(Continued)

OTHER PUBLICATIONS

International Search Report and Written Opinion for International Application No. PCT/US2016/062174 dated Mar. 6, 2017, 8 pages.
(Continued)

*Primary Examiner* — David E Smith

(57) ABSTRACT

Improved ion mirrors (10) are proposed for multi-reflecting TOF MS and electrostatic traps at various analyzer topologies. Ion mirrors (10) are constructed of printed circuit boards (11) with improved precision and flatness. To compensate for the remaining geometrical imperfections of mirror electrodes there are proposed electrode sets (17) and field structures in the ion retarding region for electronically adjusting of the ion packets time fronts, for improving the ion injection into the analyzer and for reversing the ion motion in the drift direction.

20 Claims, 4 Drawing Sheets

(30) Foreign Application Priority Data

| Aug. 6, 2017 | (GB) | 1712614 |
|---|---|---|
| Aug. 6, 2017 | (GB) | 1712616 |
| Aug. 6, 2017 | (GB) | 1712617 |
| Aug. 6, 2017 | (GB) | 1712618 |
| Aug. 6, 2017 | (GB) | 1712619 |

(56) References Cited

U.S. PATENT DOCUMENTS

| | | | |
|---|---|---|---|
| 4,691,160 | A | 9/1987 | Ino |
| 4,731,532 | A | 3/1988 | Frey et al. |
| 4,855,595 | A | 8/1989 | Blanchard |
| 5,017,780 | A | 5/1991 | Kutscher et al. |
| 5,107,109 | A | 4/1992 | Stafford, Jr. et al. |
| 5,128,543 | A | 7/1992 | Reed et al. |
| 5,202,563 | A | 4/1993 | Cotter et al. |
| 5,331,158 | A | 7/1994 | Dowell |
| 5,367,162 | A | 11/1994 | Holland et al. |
| 5,396,065 | A | 3/1995 | Myerholtz et al. |
| 5,435,309 | A | 7/1995 | Thomas et al. |
| 5,464,985 | A | 11/1995 | Cornish et al. |
| 5,619,034 | A | 4/1997 | Reed et al. |
| 5,654,544 | A | 8/1997 | Dresch |
| 5,689,111 | A | 11/1997 | Dresch et al. |
| 5,696,375 | A | 12/1997 | Park et al. |
| 5,719,392 | A | 2/1998 | Franzen |
| 5,763,878 | A | 6/1998 | Franzen |
| 5,777,326 | A | 7/1998 | Rockwood et al. |
| 5,834,771 | A | 11/1998 | Yoon et al. |
| 5,847,385 | A | 12/1998 | Dresch |
| 5,869,829 | A | 2/1999 | Dresch |
| 5,955,730 | A | 9/1999 | Kerley et al. |
| 5,994,695 | A | 11/1999 | Young |
| 6,002,122 | A | 12/1999 | Wolf |
| 6,013,913 | A | 1/2000 | Hanson |
| 6,020,586 | A | 2/2000 | Dresch et al. |
| 6,080,985 | A | 6/2000 | Welkie et al. |
| 6,107,625 | A | 8/2000 | Park |
| 6,160,256 | A | 12/2000 | Ishihara |
| 6,198,096 | B1 | 3/2001 | Le Cocq |
| 6,229,142 | B1 | 5/2001 | Bateman et al. |
| 6,271,917 | B1 | 8/2001 | Hagler |
| 6,300,626 | B1 | 10/2001 | Brock et al. |
| 6,316,768 | B1 | 11/2001 | Rockwood et al. |
| 6,337,482 | B1 | 1/2002 | Francke |
| 6,384,410 | B1 | 5/2002 | Kawato |
| 6,393,367 | B1 | 5/2002 | Tang et al. |
| 6,437,325 | B1 | 8/2002 | Reilly et al. |
| 6,455,845 | B1 | 9/2002 | Li et al. |
| 6,469,295 | B1 | 10/2002 | Park |
| 6,489,610 | B1 | 12/2002 | Barofsky et al. |
| 6,504,148 | B1 | 1/2003 | Hager |
| 6,504,150 | B1 | 1/2003 | Verentchikov et al. |
| 6,534,764 | B1 | 3/2003 | Verentchikov et al. |
| 6,545,268 | B1 | 4/2003 | Verentchikov et al. |
| 6,570,152 | B1 | 5/2003 | Hoyes |
| 6,576,895 | B1 | 6/2003 | Park |
| 6,580,070 | B2 | 6/2003 | Cornish et al. |
| 6,591,121 | B1 | 7/2003 | Madarasz et al. |
| 6,614,020 | B2 | 9/2003 | Cornish |
| 6,627,877 | B1 | 9/2003 | Davis et al. |
| 6,646,252 | B1 | 11/2003 | Gonin |
| 6,647,347 | B1 | 11/2003 | Roushall et al. |
| 6,664,545 | B2 | 12/2003 | Kimmel et al. |
| 6,683,299 | B2 | 1/2004 | Fuhrer et al. |
| 6,694,284 | B1 | 2/2004 | Nikoonahad et al. |
| 6,717,132 | B2 | 4/2004 | Franzen |
| 6,734,968 | B1 | 5/2004 | Wang et al. |
| 6,737,642 | B2 | 5/2004 | Syage et al. |
| 6,744,040 | B2 | 6/2004 | Park |
| 6,744,042 | B2 | 6/2004 | Zajfman et al. |
| 6,747,271 | B2 | 6/2004 | Gonin et al. |
| 6,770,870 | B2 | 8/2004 | Vestal |
| 6,782,342 | B2 | 8/2004 | LeGore et al. |
| 6,787,760 | B2 | 9/2004 | Belov et al. |
| 6,794,643 | B2 | 9/2004 | Russ, IV et al. |
| 6,804,003 | B1 | 10/2004 | Wang et al. |
| 6,815,673 | B2 | 11/2004 | Plomley et al. |
| 6,833,544 | B1 | 12/2004 | Campbell et al. |
| 6,836,742 | B2 | 12/2004 | Brekenfeld |
| 6,841,936 | B2 | 1/2005 | Keller et al. |
| 6,861,645 | B2 | 3/2005 | Franzen |
| 6,864,479 | B1 | 3/2005 | Davis et al. |
| 6,870,156 | B2 | 3/2005 | Rather |
| 6,870,157 | B1 | 3/2005 | Zare |
| 6,872,938 | B2 | 3/2005 | Makarov et al. |
| 6,888,130 | B1 | 5/2005 | Gonin |
| 6,900,431 | B2 | 5/2005 | Belov et al. |
| 6,906,320 | B2 | 6/2005 | Sachs et al. |
| 6,940,066 | B2 | 9/2005 | Makarov et al. |
| 6,949,736 | B2 | 9/2005 | Ishihara |
| 7,034,292 | B1 | 4/2006 | Whitehouse et al. |
| 7,071,464 | B2 | 7/2006 | Reinhold |
| 7,084,393 | B2 | 8/2006 | Fuhrer et al. |
| 7,091,479 | B2 | 8/2006 | Hayek |
| 7,126,114 | B2 | 10/2006 | Chernushevich |
| 7,196,324 | B2 | 3/2007 | Verentchikov |
| 7,217,919 | B2 | 5/2007 | Boyle et al. |
| 7,221,251 | B2 | 5/2007 | Menegoli et al. |
| 7,326,925 | B2 | 2/2008 | Verentchikov et al. |
| 7,351,958 | B2 | 4/2008 | Vestal |
| 7,365,313 | B2 | 4/2008 | Fuhrer et al. |
| 7,385,187 | B2 | 6/2008 | Verentchikov et al. |
| 7,388,197 | B2 | 6/2008 | McLean et al. |
| 7,399,957 | B2 | 7/2008 | Parker et al. |
| 7,423,259 | B2 | 9/2008 | Hidalgo et al. |
| 7,498,569 | B2 | 3/2009 | Ding |
| 7,501,621 | B2 | 3/2009 | Willis et al. |
| 7,504,620 | B2 | 3/2009 | Sato et al. |
| 7,521,671 | B2 | 4/2009 | Kirihara et al. |
| 7,541,576 | B2 | 6/2009 | Belov et al. |
| 7,582,864 | B2 | 9/2009 | Verentchikov |
| 7,608,817 | B2 | 10/2009 | Flory |
| 7,663,100 | B2 | 2/2010 | Vestal |
| 7,675,031 | B2 | 3/2010 | Konicek et al. |
| 7,709,789 | B2 | 5/2010 | Vestal et al. |
| 7,728,289 | B2 | 6/2010 | Naya et al. |
| 7,745,780 | B2 | 6/2010 | McLean et al. |
| 7,755,036 | B2 | 7/2010 | Satoh |
| 7,772,547 | B2 | 8/2010 | Verentchikov |
| 7,800,054 | B2 | 9/2010 | Fuhrer et al. |
| 7,825,373 | B2 | 11/2010 | Willis et al. |
| 7,863,557 | B2 | 1/2011 | Brown |
| 7,884,319 | B2 | 2/2011 | Willis et al. |
| 7,932,491 | B2 | 4/2011 | Vestal |
| 7,982,184 | B2 | 7/2011 | Sudakov |
| 7,985,950 | B2 | 7/2011 | Makarov et al. |
| 7,989,759 | B2 | 8/2011 | Holle |
| 7,999,223 | B2 | 8/2011 | Makarov et al. |
| 8,017,907 | B2 | 9/2011 | Willis et al. |
| 8,017,909 | B2 | 9/2011 | Makarov et al. |
| 8,063,360 | B2 | 11/2011 | Willis et al. |
| 8,080,782 | B2 | 12/2011 | Hidalgo et al. |
| 8,093,554 | B2 | 1/2012 | Makarov |
| 8,237,111 | B2 | 8/2012 | Golikov et al. |
| 8,354,634 | B2 | 1/2013 | Green et al. |
| 8,373,120 | B2 | 2/2013 | Verentchikov |
| 8,395,115 | B2 | 3/2013 | Makarov et al. |
| 8,492,710 | B2 | 7/2013 | Fuhrer et al. |
| 8,513,594 | B2 | 8/2013 | Makarov |
| 8,633,436 | B2 | 1/2014 | Ugarov |
| 8,637,815 | B2 | 1/2014 | Makarov et al. |
| 8,642,948 | B2 | 2/2014 | Makarov et al. |
| 8,642,951 | B2 | 2/2014 | Li |
| 8,648,294 | B2 | 2/2014 | Prather et al. |
| 8,653,446 | B1 | 2/2014 | Mordehai et al. |
| 8,658,984 | B2 | 2/2014 | Makarov et al. |
| 8,680,481 | B2 | 3/2014 | Giannakopulos et al. |
| 8,723,108 | B1 | 5/2014 | Ugarov |
| 8,735,818 | B2 | 5/2014 | Kovtoun et al. |
| 8,772,708 | B2 | 7/2014 | Kinugawa et al. |
| 8,785,845 | B2 | 7/2014 | Loboda |
| 8,847,155 | B2 | 9/2014 | Vestal |
| 8,853,623 | B2 | 10/2014 | Verenchikov |

(56) References Cited

U.S. PATENT DOCUMENTS

| | | |
|---|---|---|
| 8,884,220 B2 | 11/2014 | Hoyes et al. |
| 8,921,772 B2 | 12/2014 | Verenchikov |
| 8,952,325 B2 | 2/2015 | Giles et al. |
| 8,957,369 B2 | 2/2015 | Makarov |
| 8,975,592 B2 | 3/2015 | Kobayashi et al. |
| 9,048,080 B2 | 6/2015 | Verenchikov et al. |
| 9,082,597 B2 | 7/2015 | Willis et al. |
| 9,082,604 B2 | 7/2015 | Verenchikov |
| 9,099,287 B2 | 8/2015 | Giannakopulos |
| 9,136,101 B2 | 9/2015 | Grinfeld et al. |
| 9,147,563 B2 | 9/2015 | Makarov |
| 9,196,469 B2 | 11/2015 | Makarov |
| 9,207,206 B2 | 12/2015 | Makarov |
| 9,214,322 B2 | 12/2015 | Kholomeev et al. |
| 9,214,328 B2 | 12/2015 | Hoyes et al. |
| 9,281,175 B2 | 3/2016 | Haufler et al. |
| 9,312,119 B2 | 4/2016 | Verenchikov |
| 9,324,544 B2 | 4/2016 | Rather |
| 9,373,490 B1 | 6/2016 | Nishiguchi et al. |
| 9,396,922 B2 | 7/2016 | Verenchikov et al. |
| 9,417,211 B2 | 8/2016 | Verenchikov |
| 9,425,034 B2 | 8/2016 | Verentchikov et al. |
| 9,472,390 B2 | 10/2016 | Verenchikov et al. |
| 9,514,922 B2 | 12/2016 | Watanabe et al. |
| 9,576,778 B2 | 2/2017 | Wang |
| 9,595,431 B2 | 3/2017 | Verenchikov |
| 9,673,033 B2 | 6/2017 | Grinfeld et al. |
| 9,679,758 B2 | 6/2017 | Grinfeld et al. |
| 9,683,963 B2 | 6/2017 | Verenchikov |
| 9,728,384 B2 | 8/2017 | Verenchikov |
| 9,779,923 B2 | 10/2017 | Verenchikov |
| 9,786,484 B2 | 10/2017 | Willis et al. |
| 9,786,485 B2 | 10/2017 | Ding et al. |
| 9,865,441 B2 | 1/2018 | Damoc et al. |
| 9,865,445 B2 | 1/2018 | Verenchikov et al. |
| 9,870,903 B2 | 1/2018 | Richardson et al. |
| 9,870,906 B1 | 1/2018 | Quarmby et al. |
| 9,881,780 B2 | 1/2018 | Verenchikov et al. |
| 9,899,201 B1 | 2/2018 | Park |
| 9,922,812 B2 | 3/2018 | Makarov |
| 9,941,107 B2 | 4/2018 | Verenchikov |
| 9,972,483 B2 | 5/2018 | Makarov |
| 10,006,892 B2 | 6/2018 | Verenchikov |
| 10,037,873 B2 | 7/2018 | Wang et al. |
| 10,141,175 B2 | 11/2018 | Verentchikov et al. |
| 10,141,176 B2 | 11/2018 | Stewart et al. |
| 10,163,616 B2 | 12/2018 | Verenchikov et al. |
| 10,186,411 B2 | 1/2019 | Makarov |
| 10,192,723 B2 | 1/2019 | Verenchikov et al. |
| 10,290,480 B2 | 5/2019 | Crowell et al. |
| 10,373,815 B2 | 8/2019 | Crowell et al. |
| 10,388,503 B2 | 8/2019 | Brown et al. |
| 10,593,525 B2 | 3/2020 | Hock et al. |
| 10,593,533 B2 | 3/2020 | Hoyes et al. |
| 10,622,203 B2 | 4/2020 | Veryovkin et al. |
| 10,629,425 B2 | 4/2020 | Hoyes et al. |
| 10,636,646 B2 | 4/2020 | Hoyes et al. |
| 2001/0011703 A1 | 8/2001 | Franzen |
| 2001/0030284 A1 | 10/2001 | Dresch et al. |
| 2002/0030159 A1 | 3/2002 | Chernushevich et al. |
| 2002/0107660 A1 | 8/2002 | Nikoonahad et al. |
| 2002/0190199 A1 | 12/2002 | Li |
| 2003/0010907 A1 | 1/2003 | Hayek et al. |
| 2003/0111597 A1 | 6/2003 | Gonin et al. |
| 2003/0232445 A1 | 12/2003 | Fulghum |
| 2004/0026613 A1 | 2/2004 | Bateman et al. |
| 2004/0084613 A1 | 5/2004 | Bateman et al. |
| 2004/0108453 A1 | 6/2004 | Kobayashi et al. |
| 2004/0119012 A1 | 6/2004 | Vestal |
| 2004/0144918 A1 | 7/2004 | Zare et al. |
| 2004/0155187 A1 | 8/2004 | Axelsson |
| 2004/0159782 A1 | 8/2004 | Park |
| 2004/0183007 A1 | 9/2004 | Belov et al. |
| 2005/0006577 A1 | 1/2005 | Fuhrer et al. |
| 2005/0040326 A1 | 2/2005 | Enke |
| 2005/0103992 A1 | 5/2005 | Yamaguchi et al. |
| 2005/0133712 A1 | 6/2005 | Belov et al. |
| 2005/0151075 A1 | 7/2005 | Brown et al. |
| 2005/0194528 A1 | 9/2005 | Yamaguchi et al. |
| 2005/0242279 A1 | 11/2005 | Verentchikov |
| 2005/0258364 A1 | 11/2005 | Whitehouse et al. |
| 2006/0024720 A1 | 2/2006 | McLean et al. |
| 2006/0169882 A1 | 8/2006 | Pau et al. |
| 2006/0214100 A1 | 9/2006 | Verentchikov et al. |
| 2006/0289746 A1 | 12/2006 | Raznikov et al. |
| 2007/0023645 A1 | 2/2007 | Chernushevich |
| 2007/0029473 A1 | 2/2007 | Verentchikov |
| 2007/0176090 A1 | 8/2007 | Verentchikov |
| 2007/0187614 A1 | 8/2007 | Schneider et al. |
| 2007/0194223 A1 | 8/2007 | Sato et al. |
| 2008/0049402 A1* | 2/2008 | Han ............... H05K 1/0271 361/748 |
| 2008/0197276 A1 | 8/2008 | Nishiguchi et al. |
| 2008/0203288 A1 | 8/2008 | Makarov et al. |
| 2008/0290269 A1 | 11/2008 | Saito et al. |
| 2009/0090861 A1 | 4/2009 | Willis et al. |
| 2009/0114808 A1 | 5/2009 | Bateman et al. |
| 2009/0121130 A1 | 5/2009 | Satoh |
| 2009/0206250 A1 | 8/2009 | Wollnik |
| 2009/0250607 A1 | 10/2009 | Staats et al. |
| 2009/0272890 A1 | 11/2009 | Ogawa et al. |
| 2009/0294658 A1 | 12/2009 | Vestal et al. |
| 2009/0314934 A1 | 12/2009 | Brown |
| 2010/0001180 A1 | 1/2010 | Bateman et al. |
| 2010/0044558 A1 | 2/2010 | Sudakov |
| 2010/0072363 A1 | 3/2010 | Giles et al. |
| 2010/0078551 A1 | 4/2010 | Loboda |
| 2010/0096543 A1 | 4/2010 | Kenny |
| 2010/0140469 A1 | 6/2010 | Nishiguchi |
| 2010/0193682 A1 | 8/2010 | Golikov et al. |
| 2010/0207023 A1 | 8/2010 | Loboda |
| 2010/0301202 A1 | 12/2010 | Vestal |
| 2011/0133073 A1 | 6/2011 | Sato et al. |
| 2011/0168880 A1* | 7/2011 | Ristroph ............ H01J 49/406 250/282 |
| 2011/0180702 A1 | 7/2011 | Flory et al. |
| 2011/0180705 A1 | 7/2011 | Yamaguchi |
| 2011/0186729 A1 | 8/2011 | Verentchikov et al. |
| 2012/0168618 A1 | 7/2012 | Vestal |
| 2012/0261570 A1 | 10/2012 | Shvartsburg et al. |
| 2012/0298853 A1* | 11/2012 | Kurulugama ......... H01J 49/044 250/282 |
| 2013/0048852 A1 | 2/2013 | Verenchikov |
| 2013/0056627 A1 | 3/2013 | Verenchikov |
| 2013/0068942 A1* | 3/2013 | Verenchikov ......... H01J 49/401 250/282 |
| 2013/0161506 A1 | 6/2013 | Ugarov |
| 2013/0187044 A1 | 7/2013 | Ding et al. |
| 2013/0240725 A1 | 9/2013 | Makarov |
| 2013/0248702 A1 | 9/2013 | Makarov |
| 2013/0256524 A1 | 10/2013 | Brown et al. |
| 2013/0313424 A1 | 11/2013 | Makarov et al. |
| 2013/0327935 A1 | 12/2013 | Wiedenbeck |
| 2014/0054454 A1 | 2/2014 | Hoyes et al. |
| 2014/0054456 A1 | 2/2014 | Kinugawa et al. |
| 2014/0084156 A1 | 3/2014 | Ristroph et al. |
| 2014/0117226 A1 | 5/2014 | Giannakopulos |
| 2014/0138538 A1 | 5/2014 | Hieftje et al. |
| 2014/0183354 A1 | 7/2014 | Moon et al. |
| 2014/0191123 A1 | 7/2014 | Wildgoose et al. |
| 2014/0239172 A1 | 8/2014 | Makarov |
| 2014/0246575 A1 | 9/2014 | Langridge et al. |
| 2014/0291503 A1 | 10/2014 | Shchepunov et al. |
| 2014/0312221 A1 | 10/2014 | Verenchikov et al. |
| 2014/0361162 A1 | 12/2014 | Murray et al. |
| 2015/0028197 A1 | 1/2015 | Grinfeld et al. |
| 2015/0028198 A1* | 1/2015 | Grinfeld ............ H01J 49/4245 250/282 |
| 2015/0034814 A1 | 2/2015 | Brown et al. |
| 2015/0048245 A1 | 2/2015 | Vestal et al. |
| 2015/0060656 A1 | 3/2015 | Ugarov |
| 2015/0122986 A1 | 5/2015 | Haase |
| 2015/0194296 A1 | 7/2015 | Verenchikov et al. |
| 2015/0228467 A1 | 8/2015 | Grinfeld et al. |

(56) References Cited

U.S. PATENT DOCUMENTS

| | | | |
|---|---|---|---|
| 2015/0279650 A1 | 10/2015 | Verenchikov | |
| 2015/0294849 A1 | 10/2015 | Makarov et al. | |
| 2015/0318156 A1 | 11/2015 | Loyd et al. | |
| 2015/0364309 A1 | 12/2015 | Welkie | |
| 2015/0380233 A1 | 12/2015 | Verenchikov | |
| 2016/0005587 A1 | 1/2016 | Verenchikov | |
| 2016/0035558 A1 | 2/2016 | Verenchikov et al. | |
| 2016/0079052 A1 | 3/2016 | Makarov | |
| 2016/0225598 A1 | 8/2016 | Ristroph | |
| 2016/0225602 A1 | 8/2016 | Ristroph et al. | |
| 2016/0240363 A1 | 8/2016 | Verenchikov | |
| 2017/0016863 A1 | 1/2017 | Verenchikov | |
| 2017/0025265 A1 | 1/2017 | Verenchikov et al. | |
| 2017/0032952 A1 | 2/2017 | Verenchikov | |
| 2017/0084443 A1 | 3/2017 | Willis et al. | |
| 2017/0098533 A1 | 4/2017 | Stewart et al. | |
| 2017/0168031 A1 | 6/2017 | Verenchikov | |
| 2017/0229297 A1 | 8/2017 | Green et al. | |
| 2017/0338094 A1 | 11/2017 | Verenchikov et al. | |
| 2018/0144921 A1 | 5/2018 | Hoyes et al. | |
| 2018/0315589 A1 | 11/2018 | Oshiro | |
| 2018/0366312 A1* | 12/2018 | Hamish | H01J 49/40 |
| 2019/0180998 A1 | 6/2019 | Stewart et al. | |
| 2019/0206669 A1 | 7/2019 | Verenchikov et al. | |
| 2019/0237318 A1 | 8/2019 | Brown | |
| 2019/0360981 A1 | 11/2019 | Verenchikov | |
| 2020/0083034 A1 | 3/2020 | Hoyes et al. | |
| 2020/0090919 A1 | 3/2020 | Artaev et al. | |
| 2020/0126781 A1 | 4/2020 | Kovtoun | |
| 2020/0152440 A1 | 5/2020 | Hoyes et al. | |
| 2020/0168447 A1 | 5/2020 | Verenchikov | |
| 2020/0168448 A1 | 5/2020 | Verenchikov et al. | |
| 2020/0243322 A1 | 7/2020 | Stewart et al. | |
| 2020/0373142 A1 | 11/2020 | Verenchikov | |
| 2020/0373143 A1 | 11/2020 | Verenchikov et al. | |
| 2020/0373145 A1 | 11/2020 | Verenchikov et al. | |

FOREIGN PATENT DOCUMENTS

| | | |
|---|---|---|
| CN | 102131563 A | 7/2011 |
| CN | 201946564 U | 8/2011 |
| DE | 4310106 C1 | 10/1994 |
| DE | 10116536 A1 | 10/2002 |
| DE | 102015121830 A1 | 6/2017 |
| DE | 102019129108 A1 | 6/2020 |
| DE | 112015001542 B4 | 7/2020 |
| EP | 0237259 A2 | 9/1987 |
| EP | 1137044 A2 | 9/2001 |
| EP | 1566828 A2 | 8/2005 |
| EP | 1901332 A1 | 3/2008 |
| EP | 2068346 A2 | 6/2009 |
| EP | 1665326 B1 | 4/2010 |
| EP | 1789987 A4 | 9/2010 |
| EP | 1522087 B1 | 3/2011 |
| EP | 2599104 A1 | 6/2013 |
| EP | 1743354 B1 | 8/2019 |
| EP | 3662501 A1 | 6/2020 |
| EP | 3662502 A1 | 6/2020 |
| EP | 3662503 A1 | 6/2020 |
| GB | 2080021 A | 1/1982 |
| GB | 2217907 A | 11/1989 |
| GB | 2300296 A | 10/1996 |
| GB | 2390935 A | 1/2004 |
| GB | 2396742 A | 6/2004 |
| GB | 2403063 A | 12/2004 |
| GB | 2455977 A | 7/2009 |
| GB | 2476964 A | 7/2011 |
| GB | 2478300 A | 9/2011 |
| GB | 2484361 B | 5/2012 |
| GB | 2485825 A | 5/2012 |
| GB | 2484429 B | 6/2012 |
| GB | 2489094 A | 9/2012 |
| GB | 2490571 A | 11/2012 |
| GB | 2495127 A | 4/2013 |
| GB | 2495221 A | 4/2013 |
| GB | 2496991 A | 5/2013 |
| GB | 2496994 A | 5/2013 |
| GB | 2500743 A | 10/2013 |
| GB | 2501332 A | 10/2013 |
| GB | 2506362 A | 4/2014 |
| GB | 2528875 A | 2/2016 |
| GB | 2555609 A | 5/2018 |
| GB | 2556451 A | 5/2018 |
| GB | 2556830 A | 6/2018 |
| GB | 2562990 A | 12/2018 |
| GB | 2575157 A | 1/2020 |
| GB | 2575339 A | 1/2020 |
| JP | S6229049 A | 2/1987 |
| JP | 2000036285 A | 2/2000 |
| JP | 2000048764 A | 2/2000 |
| JP | 2003031178 A | 1/2003 |
| JP | 3571546 B2 | 9/2004 |
| JP | 2005538346 A | 12/2005 |
| JP | 2006049273 A | 2/2006 |
| JP | 2007227042 A | 9/2007 |
| JP | 2010062152 A | 3/2010 |
| JP | 4649234 B2 | 3/2011 |
| JP | 2011119279 A | 6/2011 |
| JP | 4806214 B2 | 11/2011 |
| JP | 2013539590 A | 10/2013 |
| JP | 5555582 B2 | 7/2014 |
| JP | 2015506567 A | 3/2015 |
| JP | 2015185306 A | 10/2015 |
| RU | 2564443 C2 | 10/2015 |
| RU | 2015148627 A | 5/2017 |
| RU | 2660655 C2 | 7/2018 |
| SU | 198034 A1 | 6/1967 |
| SU | 1681340 A1 | 9/1991 |
| SU | 1725289 A1 | 4/1992 |
| WO | 9103071 A1 | 3/1991 |
| WO | 9801218 A1 | 1/1998 |
| WO | 9808244 A2 | 2/1998 |
| WO | 0077823 A2 | 12/2000 |
| WO | 2005001878 A2 | 1/2005 |
| WO | 2005043575 A2 | 5/2005 |
| WO | 2006049623 A2 | 5/2006 |
| WO | 2006102430 A2 | 9/2006 |
| WO | 2006103448 A2 | 10/2006 |
| WO | 2007044696 A1 | 4/2007 |
| WO | 2007104992 A2 | 9/2007 |
| WO | 2007136373 A1 | 11/2007 |
| WO | 2008046594 A2 | 4/2008 |
| WO | 2008087389 A2 | 7/2008 |
| WO | 2010008386 A1 | 1/2010 |
| WO | 2010034630 A2 | 4/2010 |
| WO | 2010138781 A2 | 12/2010 |
| WO | 2011086430 A1 | 7/2011 |
| WO | 2011107836 A2 | 9/2011 |
| WO | 2011135477 A1 | 11/2011 |
| WO | 2012010894 A1 | 1/2012 |
| WO | 2012023031 A2 | 2/2012 |
| WO | 2012024468 A2 | 2/2012 |
| WO | 2012024570 A2 | 2/2012 |
| WO | 2012116765 A1 | 9/2012 |
| WO | 13045428 A1 | 4/2013 |
| WO | 13063587 A2 | 5/2013 |
| WO | 2013067366 A2 | 5/2013 |
| WO | 13093587 A2 | 6/2013 |
| WO | 2013098612 A1 | 7/2013 |
| WO | 13110587 A2 | 8/2013 |
| WO | 13124207 A1 | 8/2013 |
| WO | 2013110588 A2 | 8/2013 |
| WO | 2014021960 A1 | 2/2014 |
| WO | 2014074822 A1 | 5/2014 |
| WO | 14110697 A1 | 7/2014 |
| WO | 2014142897 A1 | 9/2014 |
| WO | 2014152902 A2 | 9/2014 |
| WO | 2015142897 A1 | 9/2015 |
| WO | 2015152968 A1 | 10/2015 |
| WO | 2015153622 A1 | 10/2015 |
| WO | 2015153630 A1 | 10/2015 |
| WO | 2015153644 A1 | 10/2015 |
| WO | 2015175988 A1 | 11/2015 |
| WO | 2015189544 A1 | 12/2015 |

(56) References Cited

FOREIGN PATENT DOCUMENTS

| WO | 2016064398 A1 | 4/2016 |
|---|---|---|
| WO | 2016174462 A1 | 11/2016 |
| WO | 2016178029 A1 | 11/2016 |
| WO | 2017042665 A1 | 3/2017 |
| WO | 2017087470 A1 | 5/2017 |
| WO | 2018073589 A1 | 4/2018 |
| WO | 2018109920 A1 | 6/2018 |
| WO | 2018124861 A2 | 7/2018 |
| WO | 2018183201 A1 | 10/2018 |
| WO | 2019030475 A1 | 2/2019 |
| WO | 2019030476 A1 | 2/2019 |
| WO | 2019030477 A1 | 2/2019 |
| WO | 2019058226 A1 | 3/2019 |
| WO | 2019162687 A1 | 8/2019 |
| WO | 2019202338 A1 | 10/2019 |
| WO | 2019229599 A1 | 12/2019 |
| WO | 2020002940 A1 | 1/2020 |
| WO | 2020021255 A1 | 1/2020 |
| WO | 2020121167 A1 | 6/2020 |
| WO | 2020121168 A1 | 6/2020 |

OTHER PUBLICATIONS

IPRP PCT/US2016/062174 dated May 22, 2018, 6 pages.
Search Report for GB Application No. GB1520130.4 dated May 25, 2016.
International Search Report and Written Opinion for International Application No. PCT/US2016/062203 dated Mar. 6, 2017, 8 pages.
Search Report for GB Application No. GB1520134.6 dated May 26, 2016.
IPRP PCT/US2016/062203, issued May 22, 2018, 6 pages.
Search Report Under Section 17(5) for Application No. GB1507363.8 dated Nov. 9, 2015.
International Search Report and Written Opinion of the International Search Authority for Application No. PCT/GB2016/051238 dated Jul. 12, 2016, 16 pages.
IPRP for application PCT/GB2016/051238 dated Oct. 31, 2017, 13 pages.
International Search Report and Written Opinion for International Application No. PCT/US2016/063076 dated Mar. 30, 2017, 9 pages.
Search Report for GB Application No. 1520540.4 dated May 25, 2016.
IPRP for application PCT/US2016/063076, dated May 29, 2018, 7 pages.
IPRP for International application No. PCT/GB17/51981 dated Jan. 8, 2019, 7 pages.
IPRP for International application No. PCT/GB2018/051206, dated Nov. 5, 2019, 7 pages.
International Search Report and Written Opinion for International Application No. PCT/GB2018/051206, dated Jul. 12, 2018, 9 pages.
Author unknown, "Electrostatic lens ," Wikipedia, Mar. 31, 2017 (Mar. 31, 2017), XP055518392, Retrieved from the Internet:URL: https://en.wikipedia.org/w/index.phptitle=Electrostatic_lens oldid=773161674 [retrieved on Oct. 24, 2018].
Hussein, O.A. et al., "Study the most favorable shapes of electrostatic quadrupole doublet lenses", AIP Conference Proceedings, vol. 1815, Feb. 17, 2017 (Feb. 17, 2017), p. 1100031-4.
Search Report for United Kingdom Application No. GB1613988.3 dated Jan. 5, 2017, 4 pages.
Sakurai et al., "A New Multi-Passage Time-of-Flight Mass Spectrometer at JAIST", Nuclear Instruments Methods in Physics Research, Section A, Elsevier, 427(1-2): 182-186, May 11, 1999. Abstract.
Guan S., et al. "Stacked-ring electrostatic ion guide", Journal of the American Society for Mass Spectrometry, Elsevier Science Inc, 7(1):101-106 (1996).
International Search Report and Written Opinion for application No. PCT/GB2018/052104, dated Oct. 31, 2018, 14 pages.
International Search Report and Written Opinion for application No. PCT/GB2018/052105, dated Oct. 15, 2018, 18 pages.
International Search Report and Written Opinion for application PCT/GB2018/052100, dated Oct. 19, 2018, 19 pages.
International Search Report and Written Opinion for application PCT/GB2018/052102, dated Oct. 25, 2018, 14 pages.
International Search Report and Written Opinion for application No. PCT/GB2018/052099, dated Oct. 10, 2018, 16 pages.
International Search Report and Written Opinion for application No. PCT/GB2018/052101, dated Oct. 19, 2018, 15 pages.
Combined Search and Examination Report under Sections 17 and 18(3) for application GB1807605.9 dated Oct. 29, 2018, 5 pages.
Toyoda et al., "Multi-Turn-Time-of-Flight Mass Spectometers with Electrostatic Sectors", Journal of Mass Spectrometry, 38: 1125-1142, Jan. 1, 2003.
Wouters et al., "Optical Design of the TOFI (Time-of-Flight Isochronous) Spectrometer for Mass Measurements of Exotic Nuclei", Nuclear Instruments and Methods in Physics Research, Section A, 240(1): 77-90, Oct. 1, 1985.
Stresau, D., et al.: "Ion Counting Beyond 10ghz Using a New Detector and Conventional Electronics", European Winter Conference on Plasma Spectrochemistry, Feb. 4-8, 2001, Lillehammer, Norway, Retrieved from the Internet:URL:https://www.etp-ms.com/file-repository/21 [retrieved on Jul. 31, 2019].
Kaufmann, R., et al., "Sequencing of peptides in a time-of-flight mass spectrometer: evaluation of postsource decay following matrix-assisted laser desorption ionisation (MALDI)", International Journal of Mass Spectrometry and Ion Processes, Elsevier Scientific Publishing Co. Amsterdam, NL, 131:355-385, Feb. 24, 1994.
Barry Shaulis et al: "Signal linearity of an extended range pulse counting detector: Applications to accurate and precise U-Pb dating of zircon by laser ablation quadrupole ICP-MS", G3: Geochemistry, Geophysics, Geosystems, 11(11):1-12, Nov. 20, 2010.
Search Report for United Kingdom Application No. GB1708430.2 dated Nov. 28, 2017.
International Search Report and Written Opinion for International Application No. PCT/GB2018/051320 dated Aug. 1, 2018.
International Search Report and Written Opinion for International Application No. PCT/GB2019/051839 dated Sep. 18, 2019.
International Search Report and Written Opinion for International Application No. PCT/GB2019/051234 dated Jul. 29, 2019.
Combined Search and Examination Report for United Kingdom Application No. GB1901411.7 dated Jul. 31, 2019.
Examination Report for United Kingdom Application No. GB1618980.5 dated Jul. 25, 2019.
Extended European Search Report for EP Patent Application No. 16866997.6, dated Oct. 16, 2019.
Combined Search and Examination Report for GB 1906258.7, dated Oct. 25, 2019.
Combined Search and Examination Report for GB1906253.8, dated Oct. 30, 2019.
Search Report under Section 17(5) for GB1916445.8, dated Jun. 15, 2020.
International Search Report and Written Opinion for International application No. PCT/GB2020/050209, dated Apr. 28, 2020, 12 pages.
Combined Search and Examination Report under Sections 17 and 18(3) for application GB1807626.5, dated Oct. 29, 2018, 7 pages.
Yavor, M.I., et al., "High performance gridless ion mirrors for multi-reflection time-of-flight and electrostatic trap mass analyzers", International Journal of Mass Spectrometry, vol. 426, Mar. 2018, pp. 1-11.
Search Report under Section 17(5) for application GB1707208.3, dated Oct. 12, 2017, 5 pages.
Communication Relating to the Results of the Partial International Search for International Application No. PCT/GB2019/01118, dated Jul. 19, 2019, 25 pages.
Doroshenko, V.M., and Cotter, R.J., "Ideal velocity focusing in a reflectron time-of-flight mass spectrometer", American Society for Mass Spectrometry, 10(10):992-999 (1999).
Kozlov, B. et al. "Enhanced Mass Accuracy in Multi-Reflecting TOF MS" www.waters.com/posters, ASMS Conference (2017).
Kozlov, B. et al. "Multiplexed Operation of an Orthogonal Multi-Reflecting TOF Instrument to Increase Duty Cycle by Two Orders" ASMS Conference, San Diego, CA, Jun. 6, 2018.

(56) References Cited

OTHER PUBLICATIONS

Examination Report under Section 18(3) for Application No. GB1906258.7, dated May 5, 2021, 4 pages.
Author unknown, "Einzel Lens", Wikipedia [online] Nov. 2020 [retrieved on Nov. 3, 2020]. Retrieved from Internet URL: https://en.wikipedia.org/wiki/Einzel_lens, 2 pages.
International Search Report and Written Opinion for International application No. PCT/GB2019/051235, dated Sep. 25, 2019, 22 pages.
International Search Report and Written Opinion for International application No. PCT/GB2019/051416, dated Oct. 10, 2019, 22 pages.
Search and Examination Report under Sections 17 and 18(3) for Application No. GB1906258.7, dated Dec. 11, 2020, 7 pages.
Carey, D.C., "Why a second-order magnetic optical achromat works", Nucl. Instrum. Meth., 189(203):365-367 (1981). Abstract.
Sakurai, T. et al., "Ion optics for time-of-flight mass spectrometers with multiple symmetry", Int J Mass Spectrom Ion Proc 63(2-3):273-287 (1985). Abstract.
Wollnik, H., and Casares, A., "An energy-isochronous multi-pass time-of-flight mass spectrometer consisting of two coaxial electrostatic mirrors", Int J Mass Spectrom 227:217-222 (2003). Abstract.
O'Halloran, G.J., et al., "Determination of Chemical Species Prevalent in a Plasma Jet", Bendix Corp Report ASD-TDR-62-644, U.S. Air Force (1964). Abstract.
Kozlov, B. et al. "High accuracy self-calibration method for high resolution mass spectra" ASMS Conference Abstract, 2019.
Kozlov, B. et al. "Fast Ion Mobility Spectrometry and High Resolution TOF MS" ASMS Conference Poster (2014).
Verenchicov, A. N. "Parallel MS-MS Analysis in a Time-Flight Tandem. Problem Statement, Method, and Instrucmental Schemes" Institute for Analytical Instrucmentation RAS, Saint-Petersburg, (2004) Abstract.
Yavor, M. I. "Planar Multireflection Time-Of-Flight Mass Analyser with Unlimited Mass Range" Institute for Analytical Instrcmentation RAS, Saint-Petersburg, (2004) Abstract.
Khasin, Y. I. et al. "Initial Experimenatl Studies of a Planar Multireflection Time-Of-Flight Mass Spectrometer" Institute for Analytical Instrucmentation RAS, Saint-Petersburg, (2004) Abstract.
Verenchicov, A. N. et al. "Stability of Ion Motion in Periodic Electrostatic Fields" Institute for Analytical Instrumentation RAS, Saint-Petersburg, (2004) Abstract.
Verenchicov., A. N. "The Concept of Multireflecting Mass Spectrometer for Continuous Ion Sources" Institute for Analytical Instrucmentation RAS, Saint-Petersburg, (2006) Abstract.
Verenchicov, A. N., et al. "Accurate Mass Measurements for Interpreting Spectra of atmospheric Pressure Ionization" Institute for Analytical Instrumentation RAS, Saint-Petersburg, (2006) Abstract.
Kozlov, B. N. et al., "Experimental Studies of Space Charge Effects in Multireflecting Time-Of-Flight Mass Spectrometes" Institute for Analytical Instrucmentation RAS, Saint-Petersburg, (2006) Abstract.
Kozlov, B. N. et al., "Multireflecting Time-Of-Flight Mass Spectrometer With an Ion Trap Source" Institute for Analytical Instrucmentation RAS, Saint-Petersburg, (2006) Abstract.
Hasin, Y. I., et al., "Planar Time-Of-Flight Multireflecting Mass Spectrometer with an Orthogonal Ion Injection Out of Continuous Ion Sources" Institute for Analytical Instrucmentation RAS, Saint-Petersburg, (2006) Abstract.
Lutvinsky Y. I. et al., "Estimation of Capacity of High Resolution Mass Spectra for Analysis of Complex Mixtures" Institute for Analytical Instrucmentation RAS, Saint-Petersburg, (2006) Abstract.
Verenchicov, A. N. et al. "Multiplexing in Multi-Reflecting TOF MS" Journal of Applied Solution Chemistry and Modeling, 6:1-22(2017).
Supplementary Partial EP Search Report for EP Application No. 16869126.9, dated Jun. 13, 2019.
Reflectron—Wikipedia, Oct. 9, 2015, Retrieved from the Internet:URL:https://en.wikipedia.org/w/index.phptitle=Reflectron oldid=684843442 [retrieved on May 29, 2019].
Scherer, S., et al., "A novel principle for an ion mirror design in time-of-flight mass spectrometry", International Journal of Mass Spectrometry, Elsevier Science Publishers, Amsterdam, NL, vol. 251, No. 1, Mar. 15, 2006.
International Search Report and Written Opinion for International Application No. PCT/EP2017/070508 dated Oct. 16, 2017, 17 pages.
Supplementary Partial EP Search Report for EP Application No. 16866997.6, dated Jun. 7, 2019.
Collision Frequency, https://en.wikipedia.org/wiki/Collision_frequency accessed Aug. 17, 2021.
International Search Report and Written Opinion for International Application No. PCT/GB2020/050471, dated May 13, 2020, 9 pages.
Search Report for GB Application No. GB2002768.6 dated Jul. 7, 2020.
Search Report for GB Application No. GB 1903779.5, dated Sep. 20, 2019.

\* cited by examiner

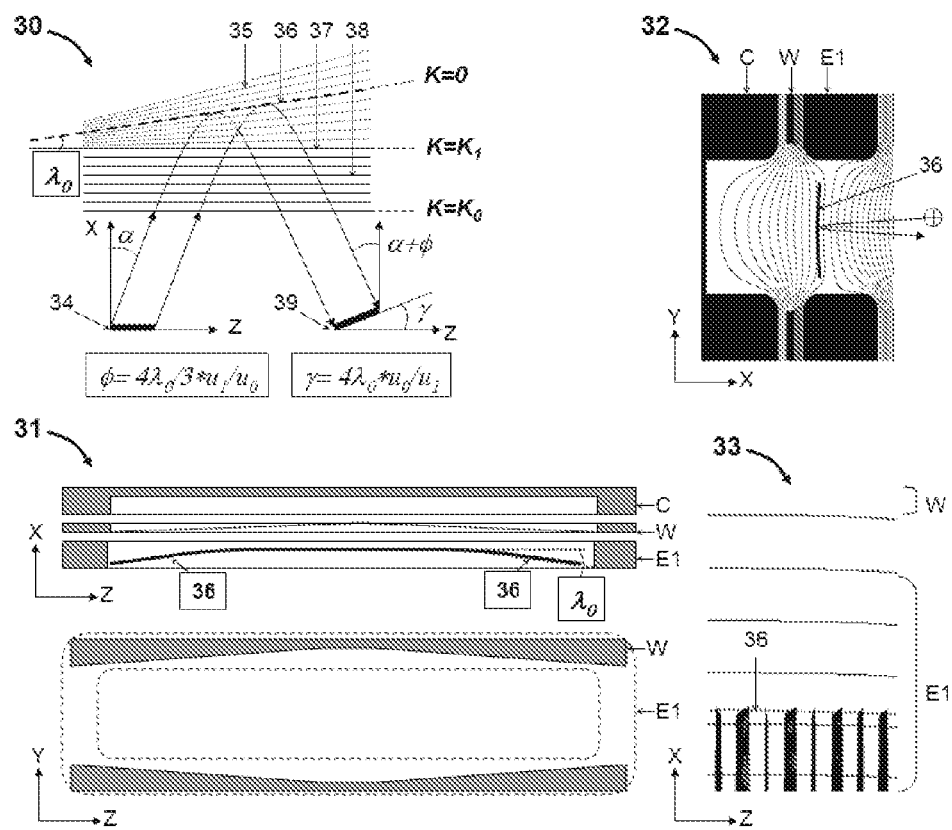
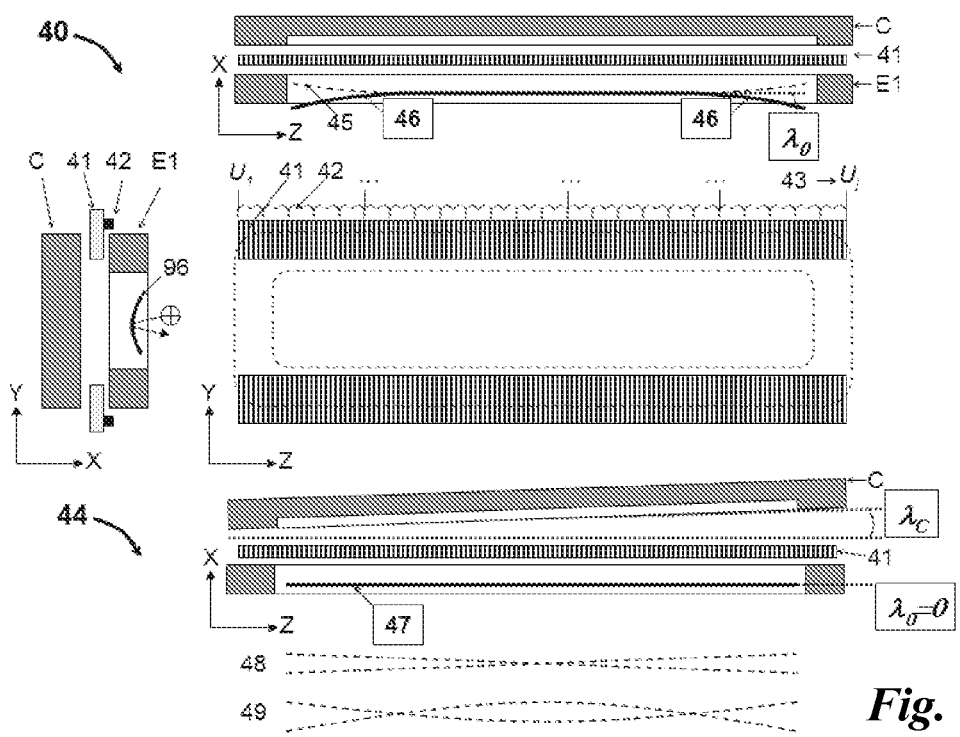
Fig. 3
Fig. 4

PRINTED CIRCUIT ION MIRROR WITH COMPENSATION

CROSS-REFERENCE TO RELATED APPLICATIONS

This application is a U.S. national phase filing under 35 U.S.C. § 371 claiming the benefit of and priority to International Patent Application No. PCT/GB2018/052102, filed on Jul. 26, 2018, which claims priority from and the benefit of United Kingdom patent application No. 1712612.9, United Kingdom patent application No. 1712613.7, United Kingdom patent application No. 1712614.5, United Kingdom patent application No. 1712616.0, United Kingdom patent application No. 1712617.8, United Kingdom patent application No. 1712618.6 and United Kingdom patent application No. 1712619.4, each of which was filed on Aug. 6, 2017. The entire content of these applications is incorporated herein by reference.

FIELD OF INVENTION

The invention relates to the area of multi-reflecting time-of-flight mass spectrometers and electrostatic ion traps, and is particularly concerned with improved gridless ion mirrors and with methods of compensating the geometrical imperfections.

BACKGROUND

Time-of-flight mass spectrometers (TOF MS) are widely used for combination of sensitivity and speed, and lately with the introduction of Multi-reflecting TOF MS (MR-TOF), for their high resolution and mass accuracy. Resolution improves primarily due substantial extension of the ion path from L=1-5 m in singly reflecting TOF to L=10-100 m in MRTOF. To fit longer ion paths into reasonable size instruments, the ion path is densely folded, as described in SU1725289, U.S. Pat. Nos. 6,107,625, 6,570,152, GB2403063, U.S. Pat. No. 6,717,132, between gridless ion mirrors.

As exemplified by U.S. Pat. No. 6,744,042, WO2011086430, US2011180702, and WO2012116765, incorporated herein by reference, multi-reflecting analyzers are proposed for electrostatic ion traps, wherein ions are trapped within isochronous electrostatic analyzers, oscillate at mass dependent frequency, and the oscillation frequency is recorded with image current detectors for acquiring mass spectra.

Some MRTOFs and electrostatic-traps (E-traps) employ similar electrostatic analyzers composed of two parallel gridless ion mirrors, separated by a drift space. Mirrors are composed of frame electrodes, which are substantially extended in a so-called drift direction, conventionally denoted as the Z-direction. If not using edge fringing fields, 2D gridless ion mirrors generate two dimensional (2D) electrostatic fields in the XY-plane between electrodes. Those fields are carefully engineered to provide for isochronous ion motion with high order compensation of time aberrations (up to full third order) and for spatial ion packet confinement in the XY-plane.

The technology of making printed circuit boards (PCBs) is mature, low cost and is a mass technology. PCBs have readily available conductive surfaces and an insulating support, insulating slots, metalized edges in vias. The technological cycle incorporates milling accurate slots, side edges, and holes. It employs vacuum compatible material with a low thermal expansion coefficient, TCE=4.5 ppm/C for FR4. At least since the 80s, there were appearing proposals on using the PCB technology for making electrodes and electrode assemblies for mass spectrometers, as exampled in U.S. Pat. Nos. 4,390,784, 4,855,595, 5,834,771, 6,614,020, 6,580,070, 7,498,569, EP1566828, U.S. Pat. Nos. 6,316,768, 7,675,031, and 8,373,120, incorporated herein by reference. PCB as used herein may refer to a component containing conductive tracks, pads and other features etched from, printed on, or deposited on one or more sheet layers of material laminated onto and/or between sheet layers of a non-conductive substrate. However, when it comes to ion mirrors, the standard technology has multiple drawbacks on precision and flatness of electrodes, which was believed to prevent the use of PCB for high quality ion mirrors.

With limited experimental use of MRTOFs and E-traps, experts have not yet recognized the crucial and key role of minor ion mirror misalignments onto performance and tuning of both MRTOFs and E-traps.

Intuitively, experts felt that inaccuracy of manufacture, electrode bend by internal material stress, limited parallelism of electrode mounting, or stray electric fields may affect the ion rays inclination angle in the mirror. Multiple complex solutions were proposed to define the ion drift advance per reflection, withstanding the analyzer misalignments and to confine the angular divergence of ion packets: U.S. Pat. No. 7,385,187 proposed periodic lens and edge deflectors for MRTOF; WO2010008386 and then US2011168880 proposed quasi-planar ion mirrors having weak (but sufficient) spatial modulation of mirror fields; U.S. Pat. No. 7,982,184 proposed splitting mirror electrodes into multiple segments for arranging $E_Z$ field; U.S. Pat. No. 8,237,111 and GB2485825 proposed electrostatic traps with three-dimensional fields, though without sufficient isochronicity in all three dimensions and without non-distorted regions for ion injection; WO2011086430 proposed first order isochronous Z-edge reflections by tilting ion mirror edge combined with reflector fields; U.S. Pat. No. 9,136,101 proposed bent ion MRTOF ion mirrors with isochronicity recovered by trans-axial lens.

However, to inventor's knowledge, so far experts had no hint of the power and the scale of the effects of ion mirror misalignment on tilting of the ion packets time-fronts, affecting isochronicity of electrostatic-analyzers. Those effects are aggregated by mixing of ion packets at multiple reflections, since ion rays are different for initially wide parallel ion packets and for initially diverging ion packets. If using PCB methods of making ion mirrors, those wedge effects are expected to ruin the analyzer isochronicity and to defeat the purpose of arranging multiple ion reflections.

It is desired to improve the design and manufacturing technology of gridless ion mirrors, e.g. for MRTOF and E-Traps, so as to withstand electrode misalignments at reasonable machining accuracy and to provide mechanisms and methods for ion mirror tuning for improved control over the ion drift motion and for improved isochronicity of electrostatic analyzers.

SUMMARY

From a first aspect the present invention provides an ion mirror comprising: a plurality of electrodes and voltage supplies connected thereto that are configured to generate an electric field region that reflects ions in a first dimension (X-dimension); wherein at least a first compensating part of the electric field region through which ions travel in use has equipotential field lines that diverge, converge or curve as a function of position along a second, orthogonal dimension (Z-direction); and wherein at least one of said electrodes is on a printed circuit board (PCB).

The compensating part of the electric field region enables the tolerances on the parallelism and dimensions of the mirror electrodes to be relaxed, enabling lower precision technologies to be used in making the ion mirror, such as the use of PCBs to form mirror electrodes.

The electrodes of the ion mirror may be configured to generate said compensating part of the electric field for compensating for electric field aberrations introduced by the PCB and/or for compensating for aberrations caused by a misalignment or bending of the PCB within the mirror.

Said compensating part of the electric field region having equipotential field lines that diverge, converge or curve enables the time front of an ion packet pulsed into the ion mirror to be tilted. This may be used, for example, to compensate for time front tilts caused by misaligned or bent ion mirror electrodes (and/or time front tilts generated in other ion optical components upstream or downstream of the ion mirror). It has been discovered that the electric field region of the embodiments may provide relatively strong time front tilting whilst providing only a minor change in the mean ion trajectory of the ion packet.

For the avoidance of doubt, the time front of the ions may be considered to be a leading edge/area of ions in the ion packet having the same mass to charge ratio (and which may have the mean average energy).

Said compensating part of the electric field region may be configured to tilt the time front of ions being reflected in the ion mirror.

The ions may enter the ion mirror having a time front arranged in a first plane, and said at least part of the electric field region may cause the time front of the ions to be tilted at an angle to the first plane.

The electrodes and voltage supplies may be configured to generate a wedge-shaped electric field region.

The wedge-shaped electric field region may be a linear wedge-shaped electric field region or may be a (slightly) curved wedge-shaped electric field region (e.g. is substantially wedge-shaped).

The ion mirror may be electrically adjustable so as to adjust the field in the electric field region.

Electrodes may be arranged and configured for generating said wedge-shaped electric field region therebetween such that equipotential field lines in the wedge-shaped electric field region are angled to each other so as to form the wedge-shape. Therefore, the equipotential field lines may converge towards one another in a direction towards a first end of the wedge-shaped electric field region (in the second dimension), and diverge away from one another in a direction towards a second opposite end of the wedge-shaped electric field region.

Ions travelling through said at least part of the electric field region may be reflected and then accelerated in the first dimension (X-dimension) by an amount that varies as a function of distance along the second dimension, since the equipotential field lines converge or diverge along the second dimension. This may cause the time front of the ions to be tilted.

The ion mirror may comprise a first PCB arranged in the plane defined by the first and second dimensions (X-Z plane), said first PCB having at least one elongated conductive strip thereon that longitudinally extends in the second dimension, the conductive strip forming one of said plurality of electrodes. Optionally, the ion mirror may further comprise a second PCB spaced apart from the first PCB in a third dimension (Y-dimension) orthogonal to the first and second dimensions; said second PCB arranged in the plane defined by the first and second dimensions (X-Z plane) and having at least one elongated conductive strip thereon that longitudinally extends in the second dimension, wherein the conductive strip forms one of said plurality of electrodes.

The first and second PCBs are arranged for the ions to pass therebetween, in use.

The elongated conductive strip(s) may be linear or may be curved.

Each of the first and/or second PCB may comprise a plurality of said conductive strips spaced apart in the first dimension.

Each of the first and/or second PCB may comprise a plurality of said conductive strips spaced apart in the first dimension, wherein the plurality of conductive strips on the PCB have been formed by providing said PCB with a conductive surface and forming one or more elongated slits therein that extend in the second dimension so as to divide the conductive surface and define the conductive strips between the slits.

Material of the conductive strip may be removed at the ends of the strips (e.g. by forming a hole in the PCB) so as to electrically isolate the conductive strips that are adjacent each other (in the first dimension).

The ion mirror may comprise side stands extending between the first and second PCBs so as to define the spacing therebetween (in the third Y-dimension). The side stands may be provided at the opposing ends of the ion mirror, in the second dimension. A side stand may be provided at each end of each conductive strip.

The ion mirror may comprise an elongated mirror cap electrode arranged between the first and second PCBs and longitudinally extending in the second dimension. The mirror cap electrode may be provided at one end of the ion mirror, in the first dimension.

The ion mirror may comprise at least one PCB having its plane arranged in the plane defined by the second dimension and a third dimension orthogonal to the first and second dimensions (Y-Z plane), said at least one PCB having at least one conductive strip thereon forming one of said plurality of electrodes.

The ion mirror may comprise a window in the PCB for allowing ions to travel therethrough, in use, wherein the conductive strip surrounds said window.

The at least one PCB may comprise a plurality of PCBs (e.g. windowed PCBs) that are spaced apart in the first dimension.

Although windowed PCBs have been described, it is alternatively contemplated that the windowed PCB may be replaced by two (or more) PCBs that are spaced apart on opposing sides of the ion mirror (in the third dimension), each having a conductive strip thereon that runs in the second dimension. The ions may pass between the PCBs in use. Third and fourth PCBs may be provided at opposing ends of these two PCBs (in the second dimension) and having conductive strips thereon that cooperate with the conductive strips on said two PCBs so as to form an electrode having an aperture through which the ions may pass in use.

The ion mirror may comprise a first base support arranged in the plane defined by the first and second dimensions (X-Z plane); and a second base support spaced apart from the first PCB in the third dimension (Y-dimension), said second base support arranged in the plane defined by the first and second dimensions (X-Z plane); wherein said at least one PCB is arranged between the base supports and attached thereto.

The at least one PCB may have a plurality of attachment ribs extending from its perimeter, and said first and second base supports may have a plurality of respective slots for receiving said ribs therein to secure the at least one PCB to the base supports. Optionally, the attachment ribs may be soldered to the base supports.

The first and/or second base support may have at least one slot recessed therein for reducing the variability in the thickness of the base support at the slot, said at least one recessed slot arranged to receive the lateral edge of a respective one of the at least one PCBs therein.

The first and/or second base support may be formed of a PCB or PCB substrate (e.g. not having the conductive surface). The first and/or second base support may therefore have substantially the same thermal coefficient of expansion as the PCBs forming the mirror electrode(s).

The ion mirror may comprise at least one stiffening rib attached to the PCB for preventing the PCB from bending.

The PCB may be any, or each, of the PCBs described hereinabove. For example, in the embodiments comprising the first and/or second PCB, at least one stiffening rib may be attached to the first and/or second PCB for preventing the PCB from bending.

The at least one stiffening rib may be an elongated rib.

At least one elongated stiffening rib attached to the PCB may longitudinally extend in the first dimension. The at least one stiffening rib may be arranged and configured to prevent the PCB to which it is attached from bending in a direction orthogonal to in the plane defined by the first and second dimensions (X-Z plane).

Alternatively, or additionally, at least one elongated stiffening rib attached to the PCB may longitudinally extend in the second dimension. The at least one stiffening rib may be arranged and configured to prevent the PCB to which it is attached from bending in a direction orthogonal to in the plane defined by the first and second dimensions (X-Z plane).

Alternatively, or additionally, at least one elongated stiffening rib attached to the PCB may longitudinally extend in the third dimension. The at least one stiffening rib may be arranged and configured to prevent the PCB to which it is attached from bending in a direction orthogonal to in the plane defined by the second and third dimensions (Y-Z plane).

Each of the at least one stiffening rib may be a planar member having its plane oriented orthogonal to the plane of the PCB to which it is attached.

The first and/or second base support, and/or the at least one stiffening rib, may be formed from PCB or PCB substrate.

The first and/or second base support, and/or the at least one stiffening rib, may therefore have substantially the same thermal coefficient of expansion as the PCBs forming the mirror electrode(s).

The PCB substrate may be absent conductive coatings or traces.

The PCBs referred to herein may have substrates formed from either ceramic or epoxy based material with glass filling.

The ion mirror may comprise one or more electrodes defining an opening through which the ions pass, wherein the opening has a width in a third dimension (Y-dimension) orthogonal to the first and second dimensions that varies as a function of position along the second dimension (Z-direction) for generating said equipotential field lines that diverge, converge or curve.

The width may vary over at least part of the length (in the second dimension) of the ion mirror.

The width may increase as a function of distance away from one end (or both ends), in the second dimension, of the ion mirror.

The width of the opening may taper (e.g. progressively and gradually) as a function of position along the second dimension.

The opening may be a slotted aperture formed through an electrode. Alternatively, the opening may be defined between electrodes arranged on opposing sides of the ion mirror in the third dimension (Y-dimension) that is orthogonal to the first and second dimensions.

Said one or more electrodes having the opening of varying width may be arranged between (in the first dimension) an end cap electrode of the ion mirror and a frame electrode of the ion mirror, wherein the frame electrode comprises an opening through which the ions pass. The opening in the frame electrode may have a width in the third dimension that is substantially constant as a function of position along the second dimension and/or a length in the second dimension that is substantially constant as a function of position along the third dimension.

Said compensating part of the electric field region having equipotential field lines that diverge, converge or curve may be formed by at least one electrode being tilted relative to other mirror electrodes.

The mirror may therefore comprise one or more first electrode arranged in a first plane and one or more second electrode arranged in a second plane that is angled to the first plane so as to define the electric field region having equipotential field lines that diverge, converge or curve between the one or more first electrode and one or more second electrode. The first and second planes may be angled with respect to each other in the plane defined by the first and second dimensions (X-Z plane).

Each of the first and second electrodes may be a frame electrode of the ion mirror, wherein the frame electrode comprises an opening through which the ions pass.

Alternatively, the first electrode may be a frame electrode of the ion mirror and the second electrode may be the end cap electrode.

The ion mirror may comprise electrodes arranged on opposing sides of the ion mirror in a third dimension (Y-dimension) that is orthogonal to the first and second dimensions, wherein the ion mirror comprises one or more voltage supply configured to apply different voltages to different ones of these electrodes for generating said equipotential field lines that diverge, converge or curve. Optionally, these electrodes may be arranged on a printed circuit board.

The voltage supplies may be configured to be adjustable so as to adjust the voltages applied to the electrodes, e.g. to compensate for one or more time front tilt introduced to ions passing through the ion mirror, in use, due to the (mis)alignment or bending of electrodes in the ion mirror.

The ion mirror may comprise one or more first electrode arranged on a first side of the ion mirror, in the third dimension, and a plurality of second electrodes arranged on a second opposite side of the ion mirror; wherein the ion mirror is configured to apply different voltages to different ones of the second electrodes for generating said equipotential field lines that diverge, converge or curve.

The different voltages may be DC voltages.

The second electrodes may be connected by a resistive chain such that a voltage supply connected to the resistive chain applies different electrical potentials to the second electrodes.

The ion mirror may be configured to apply different voltages to different ones of the first electrodes. The first electrodes may be connected by a resistive chain such that a voltage supply connected to the resistive chain applies different electrical potentials to the first electrodes.

Embodiments are also contemplated in which at least some of the electrodes connected by the resistive chain are replaced by a resistive layer.

Said one or more first electrode and/or said plurality of second electrodes may be arranged on a PCB. PCB as used herein may refer to a component containing conductive tracks, pads and other features etched from, printed on, or deposited on one or more sheet layers of material laminated onto and/or between sheet layers of a non-conductive substrate.

In embodiments in which electrodes are arranged on a PCB, a resistive layer may be provide between the electrodes, so as to avoid the insulating material of the substrate from becoming electrically charged.

The ion mirror may comprise a voltage supply and electrodes configured to apply a static electric field in an ion acceleration region adjacent, in a direction in which the ions are reflected, said compensating part of the electric field region; said ion acceleration region having parallel equipotential field lines for accelerating the ions out of the ion mirror.

The inventor has discovered that the ion acceleration region provides a strong amplifying effect onto the tilting angle of the ion packet time front (caused by said compensating part of the electric field region), whilst providing only a minor change in the mean ion trajectory.

The parallel equipotential field lines of the ion acceleration region may be parallel with the second dimension (Z-dimension) and may be formed by parallel electrodes that are parallel with the second dimension.

The ions may travel through the ion acceleration region substantially orthogonal to the parallel equipotential field lines.

The ion acceleration region may amplify the time front tilt of ions introduced by said part of the electric field region.

The ion mirror may have a first length in the second dimension that comprises said compensating electric field region, and a second length in the second dimension that includes only parallel equipotential field lines for reflecting ions. Optionally, the ion mirror has a third length in the second dimension that comprises said compensating electric field region.

The first length may be arranged at a first end of the ion mirror; and the third length may be arranged at a second opposite end of the ion mirror (in the second dimension), with the second length between the first and third lengths.

The electrodes and voltage supplies of the ion mirror may be configured to allow the ions to drift in the second dimension (Z-direction) as they are being reflected in the first dimension (X-dimension).

The electrodes of said ion mirror may be substantially elongated in the second dimension and may form a substantially two-dimensional electrostatic field in plane orthogonal defined by the first dimension (X-dimension) and a third dimension (Y-dimension) orthogonal to the first and second dimensions.

The electrodes for generating said electric field region may be arranged to reflect ions substantially transverse to the equipotential field lines.

The equipotential field lines may diverge, converge or curve as a function of position along the second dimension (Z-direction) in an ion retarding region of the ion mirror.

The ion retarding equipotential (e.g. the equipotential at which the ion mirror turns the ions) may be tilted or curved relative to the second dimension.

The ion mirror may be an electrostatic gridless ion mirror.

The ion mirror may be part of an electrostatic isochronous mass analyzer.

The present invention also provides a mass spectrometer comprising: a time-of-flight mass analyser or electrostatic ion trap having at least one ion mirror as described hereinabove and a pulsed ion accelerator for pulsing ion packets into the ion mirror.

The pulsed ion accelerator may be one of: (i) a MALDI source; (ii) a SIMS source; (iii) a mapping or imaging ion source; (iv) an electron impact ion source; (v) a pulsed converter for converting a continuous or pseudo-continuous ion beam into ion pulses; (vi) an orthogonal accelerator; (vii) a pass-through orthogonal accelerator having an electrostatic ion guide; or (viii) a radio-frequency ion trap with pulsed ion ejection.

The pulsed ion accelerator may form ion packets that are elongated in the second direction.

The mass analyser may be an isochronous mass analyser.

The spectrometer may be an open trap mass spectrometer or an ion trap mass spectrometer with an image current detector.

The spectrometer may comprise a multi-pass time-of-flight mass analyser or electrostatic ion trap having at least one ion mirror as described hereinabove, and electrodes arranged and configured so as to provide an ion drift region that is elongated in a drift direction (z-dimension) and to reflect or turn ions multiple times in an oscillating dimension (x-dimension) that is orthogonal to the drift direction. Optionally, the drift direction (z-dimension) may correspond to said second dimension and/or the oscillating dimension (x-dimension) may correspond to said first dimension.

The multi-pass time-of-flight mass analyser may be a multi-reflecting time of flight mass analyser having two ion mirrors that are elongated in the drift direction (z-dimension) and configured to reflect ions multiple times in the oscillation dimension (x-dimension), wherein at least one of said two ion mirrors is an ion mirror as described hereinabove. Alternatively, the multi-pass time-of-flight mass analyser may be a multi-turn time of flight mass analyser having an ion mirror as described hereinabove and at least one electric sector may be configured to reflect and turn ions multiple times in the oscillation dimension (x-dimension).

Where the mass analyser is a multi-reflecting time of flight mass analyser, the mirrors may be gridless mirrors.

Each mirror may be elongated in the drift direction and may be parallel to the drift dimension.

The spectrometer may comprise an ion deflector configured to back-steer the average ion trajectory of the ions, in the drift direction, thereby tilting the angle of the time front of the ions.

The ion deflector may be located downstream or upstream of said ion mirror.

The ion deflector may be located at substantially the same position in the drift direction as said compensating part of the electric field region having equipotential field lines that diverge, converge or curve.

The average ion trajectory of the ions travelling through the ion deflector may have a major velocity component in the oscillation dimension (x-dimension) and a minor velocity component in the drift direction. The ion deflector back-steers the average ion trajectory of the ions passing therethrough by reducing the velocity component of the ions in the drift direction. The ions may therefore continue to travel in the same drift direction upon entering and leaving the ion deflector, but with the ions leaving the ion deflector having a reduced velocity in the drift direction. This enables the ions to oscillate a relatively high number of times in the oscillation dimension, for a given length in the drift direction, thus providing a relatively high resolution. Additionally, or alternatively, the steering may be arranged such that the ions do not impact on ion optical elements other than the active surface of the detector, such as rims of the orthogonal accelerator, ion deflector or detector.

It is alternatively contemplated that the ion deflector may be configured to reverse the direction of the ions in the second dimension.

Said compensating electric field region may be configured to tilt the time front of the ions passing therethrough so as to at least partially counteract a tilting of the time front by the ion deflector.

If the deflector is arranged downstream of the ion mirror, the ion mirror may tilt the time front of the ions in a first angular direction and the ion deflector may then tilt the angle of the time front in the opposite angular direction, at least partially back towards the plane it was in when the ions entered the ion mirror.

If the deflector is arranged upstream of the ion mirror, the deflector may tilt the time front of the ions in a first angular direction and the ion mirror may then tilt the angle of the time front in the opposite angular direction, at least partially back towards the plane it was in when the ions entered the ion deflector.

The time-front tilt angle introduced by the ion mirror and the ion steering angle introduced by the ion deflector may be electrically adjusted, or set, to compensate the T|Z and/or T/ZZ time-of-flight aberrations at the detector.

The ion deflector may be an electrostatic deflector.

The ion deflector may be configured to generate a quadrupolar field for controlling the spatial focusing of the ions in the drift direction.

It has been recognised that a conventional ion deflector inherently has a relatively high focusing effect on the ions, hence undesirably increasing the angular spread of the ion trajectories exiting the deflector, as compared to the angular spread of the ion trajectories entering the ion deflector. This may cause excessive spatial defocusing of the ions downstream of the focal point, resulting in ion losses and/or causing ions to undergo different numbers of oscillations in the spectrometer before they reach the detector. This may cause spectral overlap due to ions from different ion packets being detected at the same time. The mass resolution of the spectrometer may also be adversely affected. Such conventional ion deflectors are therefore particularly problematic in multi-pass time-of-flight mass analysers or multi-pass electrostatic ion traps, since a large angular spread of the ions will cause any given ion packet to diverge a relatively large amount over the relatively long flight path through the device. Embodiments of the present invention provide an ion deflector configured to generate a quadrupolar field that controls the spatial focusing of the ions in the drift direction, e.g. so as to maintain substantially the same angular spread of the ions passing therethrough, or to allow only the desired amount of spatial focusing of the ions in the z-direction.

The quadrupolar field in the drift direction may generate the opposite ion focusing or defocusing effect in the dimension orthogonal to the drift direction and oscillation dimension. However, it has been recognised that the focal properties of MPTOF mass analyser (e.g. MRTOF mirrors) or electrostatic trap are sufficient to compensate for this.

The ion deflector may be configured to generate a substantially quadratic potential profile in the drift direction.

The ion deflector may back steer all ions passing therethrough by the same angle; and/or the ion deflector may control the spatial focusing of the ion packet in the drift direction such that the ion packet has substantially the same size in the drift dimension when it reaches an ion detector in the spectrometer as it did when it enters the ion deflector.

The ion deflector may control the spatial focusing of the ion packet in the drift direction such that the ion packet has a smaller size in the drift dimension when it reaches a detector in the spectrometer than it did when it entered the ion deflector.

At least one voltage supply may be provided that is configured to apply one or more first voltage to one or more electrode of the ion deflector for performing said back-steer and one or more second voltage to one or more electrode of the ion deflector for generating said quadrupolar field for said spatial focusing, wherein the one or more first voltage is decoupled from the one or more second voltage.

The ion deflector may comprise at least one plate electrode arranged substantially in the plane defined by the oscillation dimension and the dimension orthogonal to both the oscillation dimension and the drift direction (X-Y plane), wherein the plate electrode is configured back-steer the ions; and the ion deflector may comprise side plate electrodes arranged substantially orthogonal to the at least one plate electrode and that are maintained at a different potential to the plate electrode for controlling the spatial focusing of the ions in the drift direction.

The side plates may be Matsuda plates.

The at least one plate electrode may comprise two electrodes and a voltage supply for applying a potential difference between the electrodes so as to back-steer the average ion trajectory of the ions, in the drift direction.

The two electrodes may be a pair of opposing electrodes that are spaced apart in the drift direction.

However, it is contemplated that only the upstream electrode (in the drift direction) may be provided, so as to avoid ions hitting the downstream electrode.

The ion deflector may be configured to provide said quadrupolar field by comprising one or more of: (i) a trans-axial lens/wedge; (iii) a deflector with aspect ratio between deflecting plates and side walls of less than 2; (iv) a gate shaped deflector; or (v) a toroidal deflector such as a toroidal sector.

The ion deflector may be arranged such that it receives ions that have already been reflected or turned in the oscillation dimension by the multi-pass time-of-flight mass analyser or electrostatic ion trap; optionally after the ions have been reflected or turned only a single time in the oscillation dimension by the multi-pass time-of-flight mass analyzer or electrostatic ion trap.

The location of the deflector directly after the first ion mirror reflection allows yet denser ray folding The ion mirror having said equipotential field lines that diverge or converge and ion deflector may tilt the time front of the ions so that it is aligned with the ion receiving surface of the ion detector and/or to be parallel to the drift direction (z-dimension).

The mass analyser or electrostatic trap may be an isochronous and/or gridless mass analyser or an electrostatic trap.

The mass analyser or electrostatic trap may be configured to form an electrostatic field in a plane defined by the oscillation dimension and the dimension orthogonal to both the oscillation dimension and drift direction (i.e. the XY-plane).

This two-dimensional field may have a zero or negligible electric field component in the drift direction (in the ion passage region). This two-dimensional field may provide isochronous repetitive multi-pass ion motion along a mean ion trajectory within the XY plane.

The energy of the ions received at the pulsed ion accelerator and the average back steering angle of the ion deflector may be configured so as to direct ions to an ion detector after a pre-selected number of ion passes (i.e. reflections or turns).

The spectrometer may comprise an ion source. The ion source may generate an substantially continuous ion beam or ion packets.

The spectrometer may comprise a pulsed ion accelerator such as a gridless orthogonal accelerator.

The pulsed ion accelerator has a region for receiving ions (a storage gap) and may be configured to pulse ions orthogonally to the direction along which it receives ions. The pulsed ion accelerator may receive a substantially continuous ion beam or packets of ions, and may pulse out ion packets.

The drift direction may be linear (i.e. a dimension) or it may be curved, e.g. to form a cylindrical or elliptical drift region.

The mass analyser or ion trap may have a dimension in the drift direction of: ≤1 m; ≤0.9 m; ≤0.8 m; ≤0.7 m; ≤0.6 m; or ≤0.5 m. The mass analyser or trap may have the same or smaller size in the oscillation dimension and/or the dimension orthogonal to the drift direction and oscillation dimension.

The mass analyser or ion trap may provide an ion flight path length of: between 5 and 15 m; between 6 and 14 m; between 7 and 13 m; or between 8 and 12 m.

The mass analyser or ion trap may provide an ion flight path length of: ≤20 m; ≤15 m; ≤14 m; ≤13 m; ≤12 m; or ≤11 m. Additionally, or alternatively, the mass analyser or ion trap may provide an ion flight path length of: ≥5 m; ≥6 m; ≥7 m; ≥8 m; ≥9 m; or ≥10 m. Any ranges from the above two lists may be combined where not mutually exclusive.

The mass analyser or ion trap may be configured to reflect or turn the ions N times in the oscillation dimension, wherein N is: ≥5; ≥6; ≥7; ≥8; ≥9; ≥10; ≥11; ≥12; ≥13; ≥14; ≥15; ≥16; ≥17; ≥18; ≥19; or ≥20. The mass analyser or ion trap may be configured to reflect or turn the ions N times in the oscillation dimension, wherein N is: ≤20; ≤19; ≤18; ≤17; ≤16; ≤15; ≤14; ≤13; ≤12; or ≤11. Any ranges from the above two lists may be combined where not mutually exclusive.

The spectrometer may have a resolution of: ≥30,000; ≥40,000; ≥50,000; ≥60,000; ≥70,000; or ≥80,000.

The spectrometer may be configured such that the pulsed ion accelerator receives ions having a kinetic energy of: ≥20 eV; ≥30 eV; ≥40 eV; ≥50 eV; ≥60 eV; between 20 and 60 eV; or between 30 and 50 eV. Such ion energies may reduce angular spread of the ions and cause the ions to bypass the rims of the orthogonal accelerator.

The spectrometer may comprise an ion detector.

The detector may be an image current detector configured such that ions passing near to it induce an electrical current in it. For example, the spectrometer may be configured to oscillate ions in the oscillation dimension proximate to the detector, inducing a current in the detector, and the spectrometer may be configured to determine the mass to charge ratios of these ions from the frequencies of their oscillations (e.g. using Fourier transform technology). Such techniques may be used in the electrostatic ion trap embodiments.

The detector for an electrostatic trap may alternatively be a sampling detector, e.g. as described in WO2011086430, FIG. 11. Ion packets may pass multiple times through a substantially (e.g. 99%) transparent mesh. A small proportion of the ions (e.g. 1%) hit the mesh and generate secondary electrons, which may be sampled. For example, the electrons may be detected by a detector (such as a TOF detector), e.g. a MCP or SEM. This may generate a series of periodic sharp signals, which may be interpreted similar to the Fourier transform MS method. The sharp signal improves resolution over standard image current signals. The detection of individual ions also improves sensitivity over an image current detector.

Alternatively, the ion detector may be an impact ion detector that detects ions impacting on a detector surface. The detector surface may be parallel to the drift dimension.

The ion detector may be arranged between the ion mirrors (or ion mirror and sectors), e.g. midway between (in the oscillation dimension) opposing ion mirrors.

The present invention also provides a method of mass spectrometry comprising: providing an ion mirror or mass spectrometer as described hereinabove; applying voltages to electrodes of the ion mirror so as to generate said electric field region having equipotential field lines that diverge, converge or curve as a function of position along the second dimension (Z-direction); and reflecting ions in the ion mirror in the first dimension (X-dimension).

The method may comprise tilting the time front of the ions in the ion mirror.

The method may comprise varying the divergence, convergence or curvature of the equipotential field lines (as a function of position along the second dimension) with time.

The ion mirror may comprise a voltage supply and electrodes that apply a static electric field in an ion acceleration region adjacent (in a direction in which the ions are reflected) said part of the electric field region having equipotential field lines that diverge, converge or curve; said ion acceleration region having parallel equipotential field lines for accelerating the ions out of the ion mirror.

The method may comprise varying the strength of the static electric field as a function of time.

The steps of varying the equipotential field lines and/or a static electric field may be performed so as to change the tilt of the time front of the ions.

The ion mirror may comprise electrodes arranged on opposing sides of the ion mirror in a third dimension (Y-dimension) orthogonal to the first and second dimensions, and the method may comprise: applying different voltages to different ones of these electrodes so as to generate said equipotential field lines that diverge, converge or curve; and adjusting the voltage supplies as a function of time so as to vary the voltages applied to the electrodes and the divergence, convergence or curvature of said equipotential field lines.

The voltage supplies may be adjusted until the voltages applied to the tuning electrodes compensate for one or more time front tilt introduced to ions passing through the ion mirror, in use, due to the (mis)alignment or bending of electrodes in the ion mirror.

Contrary to knowledge of prior art, minor wedges in the field structure of ion mirrors, an in particularly in the ion retarding region, actually produce much stronger tilt of time-fronts at much smaller ion ray steering. Apparently, electrode non parallelism in the range of one milli-radian may ruin isochronicity of multi-reflecting analyzer.

To use low cost and mass technology of printed circuit boards (PCB) for making electrodes of multi-reflecting TOF instruments, while expecting misalignments and limited parallelism and limited flatness of such electrodes at 0.1 mm range, embodiments of the invention provide: (a) improving stiffness of electrodes by orthogonal ribs, preferably made of PCB as well, preferably attached by soldering for technological convenience; (b) improving precision of the overall ion mirror structure by milling of attachment slots to compensate for variations of the board thickness; (c) improving precision of edge coatings by using electrolytic coating, used for coating of PCB vias; and, since above measures are not yet sufficient for obtaining necessary precision, and in accordance with the most important aspect of the invention, (d) introducing mechanisms and methods to compensate for electrode misalignments. There are two generic approaches to this: one is global—to compensate for overall time-front tilt with deflectors; the other is local—to correct wedge field locally, i.e. within next pair of ion reflections.

An embodiment of the present invention provides a multi-reflecting electrostatic analyzer there is provided an ion mirror comprising:
(a) a set of electrodes, formed by conductive surfaces on at least one printed circuit board;
(b) said at least one board is constructed either of ceramics or of epoxy based materials with glass filling;
(c) a set of slits in said board for isolating said electrodes;
(d) partial metal coatings on the edges of said slits;
(e) at least one rib, orthogonally attached to said at least one board for stiffness and straightness of said board; and
(f) at least one compensating electrode placed within the ion retarding region of said ion mirror for arranging wedge and/or arc curvature of the ion retarding field for compensating intrinsic inaccuracy and flexing of said at least one board.

Preferably, said at least one compensating electrode may comprise one of the group: (i) an electrode placed in the region of ion retarding field of said ion mirror and oriented substantially orthogonal to the field lines; said compensating electrode having a wedge or curved slot for non-uniform shielding of electrostatic field; (ii) a set of conductive pads on said at least one board or on an auxiliary board, interconnected by a resistive chain and energies by auxiliary power supplies or via resistive chains with other electrodes of said ion mirror; and (iii) an ion mirror electrode, separated by a curved or tilted slot.

Preferably, said at least one compensating electrode may comprise at least one deflector within a field free region of said electrostatic analyzer.

Preferably, said at least one rib may be soldered to said at least one board.

Preferably, said mirror may further comprise machined slots for attachment of said at least one rib for compensating variation in thickness of said at least one board.

Preferably, said mirror may further comprise at least one technological feature of the group: (i) aligning holes; and (ii) side edges machined at the same board installation as said slits.

Preferably, said analyzer may comprise at least a pair of said boards, interconnected with stiff and thick mounting plates.

Preferably, the topology of said ion mirror may be one of the group: (i) planar; (ii) circular; (iii) arc bent.

Preferably, said slits may be curved.

Preferably, said electrostatic analyzer may be either time-of-flight mass spectrometer or an electrostatic ion trap mass spectrometer.

An embodiment of the present invention provides a multi-reflecting mass spectrometer comprising:
(a) a pulsed ion source or a pulsed converter generating ion packets substantially elongated in the first Z-direction;
(b) a pair of parallel gridless ion mirrors separated by a drift space; electrodes of said ion mirrors are substantially elongated in the Z-direction to form a two-dimensional electrostatic field in an orthogonal XY-plane; said field provides for an isochronous repetitive multi-pass ion motion and spatial ion confinement along a zigzag mean ion trajectory lying within the XY symmetry plane;
(c) an ion detector;
(d) at least one electrically adjustable electrostatic deflector, arranged for steering of ion trajectories for angle $\psi$, associated with equal tilting of ion packets time-front;
(e) at least one compensating electrode to form at least one electrically adjustable wedge electrostatic field with diverging equi-potential lines in the retarding region of said ion mirror, followed by electrostatic acceleration in "flat" field with parallel equi-potentials; said at least one wedge field is arranged for the purpose of adjusting the time-front tilt angle $\gamma$ of said ion packets, associated with steering of ion trajectories at much smaller (relative to said angle $\gamma$) inclination angle $\delta$;
(f) wherein said steering angles $\psi_j$ and $\delta_i$ are arranged for either denser folding of ion trajectories, and/or for bypassing rims of said source or of said deflector or of said detector by ion packets, and/or for reverting ion drift motion; and
(g) wherein said time-front tilt angle $\gamma$ and said ion steering angles $\psi$ are electrically adjusted for compensating the T|Z and/or T/ZZ time-of-flight aberrations on said detector.
(h) wherein either electrodes of said ion mirror or said compensation electrode are constructed with printed circuit board.

BRIEF DESCRIPTION OF THE DRAWINGS

Various embodiments will now be described, by way of example only, and with reference to the accompanying drawings in which:

FIG. 3 shows a novel amplifying reflecting wedge field an embodiment of the present invention used for providing an electrically adjustable tilt of ion packets time-fronts; shows one mirror wedge achieved with a wedge slit; and presents simulated field structure with bent retarding equipotential;

FIG. 4 shows another embodiment of the present invention of the amplifying wedge mirror field, achieved with an auxiliary printed circuit board (PCB), and shows compensation of unintentional misalignment of ion mirror electrodes;

DETAILED DESCRIPTION

As described below, the proposed compensation mechanism and method based on electrically controlled wedge fields allows compensating non-parallelism of electrodes. As a result, the precision requirements onto parallelism and precision of ion mirrors electrodes may be relaxed, e.g. from the range of tens of microns to the range of 100-300 um and, hence, may allow using lower precision technologies. Embodiments of the invention propose ion mirrors manufactured with more robust, reproducible, and lower cost technology of printed circuit boards (PCB) at standard (for PCB) precision, being notably lower than the precision obtainable at standard electrode machining.

At least two types of standard PCB materials are considered herein: an epoxy based and glass filled material, like FR4 with a thickness from 0.3 to 10 mm, or thin (0.5-1.5 mm) ceramic PCB materials like alumina oxide or alumina nitride. For conductive pads, the application considers standard conductive coatings such as so-called soft gold, i.e. nickel containing coating. However, other materials and coatings may be used. Preferably, insulating surfaces arranged within reach of stray ions may be coated by antistatic material, like tin oxide suspension.

While considering PCB technology for constructing precise and high quality ion mirrors, there is provided an analysis of multiple intrinsic problems of PCB technology and there are suggested ways of curing those problems.

Figure 1:
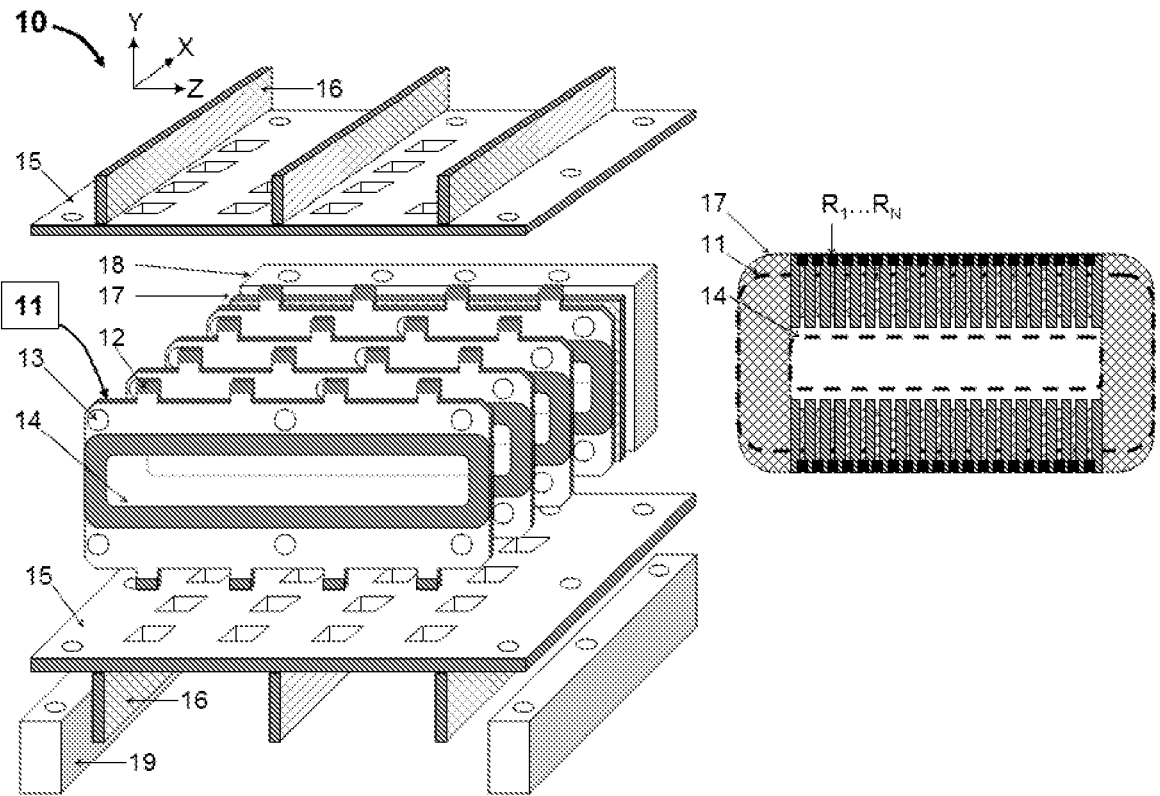
FIG. 1 shows one embodiment of the present invention of an ion mirror constructed of PCB boards and comprising at least one compensating electrode for arranging a wedge or arc field in the ion retarding region for electronically adjusted correction of mirror electrode misalignments.

Referring to FIG. 1, one embodiment 10 of PCB ion mirror of the present invention comprises: PCB electrodes 11 having conductive window 14, attachment ribs 12, and optional aligning holes 13; a base support 15; stiffing ribs 16 and/or stiffing supports 19; a compensating PCB 17 with multiple conductive pads, interconnected via resistive chain $R_1 \ldots R_N$; and an optional spacing electrode 18. PCB ion mirror 10 incorporates several advanced and novel features to solve deficiencies of the standard PCB technology:

It is important that compensating PCB 17 is used to form an electronically controlled wedge and/or arc reflecting fields (described below in FIG. 3) for the purpose of compensating misalignments and limited parallelism of electrodes 11, specified at 0.1 mm in the PCB technology. It is believed that PCB ion mirrors of prior art are unable to operate in practice without this feature.

The internal edge of window 14 is made conductive, similarly to standard PCB vias (usually made electrolytic). The preferred coating is Nickel, referred to in the PCB industry as soft gold. The conductive rim may be at least three times wider than the gaps between electrodes 11 to minimize the insulator exposure and to avoid field effects of charged surfaces.

The tracking distance of uncoated PCB may be arranged at outer sides of PCB 11 to reduce the surface gradient under 300-500V/mm, where surface discharges are known to start at 1 kV/mm. Yet a larger tracking distance may be obtained if avoiding direct contact between edges of electrode 11 and base plate 15.

Though base support 15, stiffing ribs 16 or stiffing supports 19 may be made of any mechanically stable material, preferably, we propose PCB material for matching the thermal expansion coefficient (TCE) of electrodes 11, e.g. being 4-5 ppm/C for widely used FR-4 PCB material, about 5-6 ppm/C for alumina, and 4-5 ppm/C for AlN. Otherwise, large thermal variations (specified from −50 to +50 C) at instrument transportation may ruin the ion mirror precision and flatness. Optionally, one may use more expensive materials with close TCE, say Titanium or ceramics, however, the inventor is not aware of any low cost material with matching TCE, except G-10 (equivalent of FR-4 PCB), which is far less preferable for reasons of generating dust and chips. Moreover, PCB supports and ribs allow convenient soldering. Slits in supports 15 are aligned with electrode ribs 12, so that ribs could be soldered at outer sides of PCB 15.

Embodiment 10 may be designed to compensate for the expected moderate PCB flexing. PCB electrodes 11 are stiff in the X- and Y-direction. Multiple aligning ribs 12 are soldered to slits/slots in the base support 15, providing stiffness in the Z-direction. Flexing of base PCB plate 15 in the Y-direction (harmful at precision assembly) may be compensated by attaching stiffing PCB ribs 16, or stiffing supports 19. Supports 19 may be metal (say aluminium) if using a hole and slit mounting to overcome TCE mismatch. Thus, PCB flexing is prevented in the fully assembled ion mirror in all three directions, where initial parallelism before soldering may be improved by technological jigs.

Figure 2:
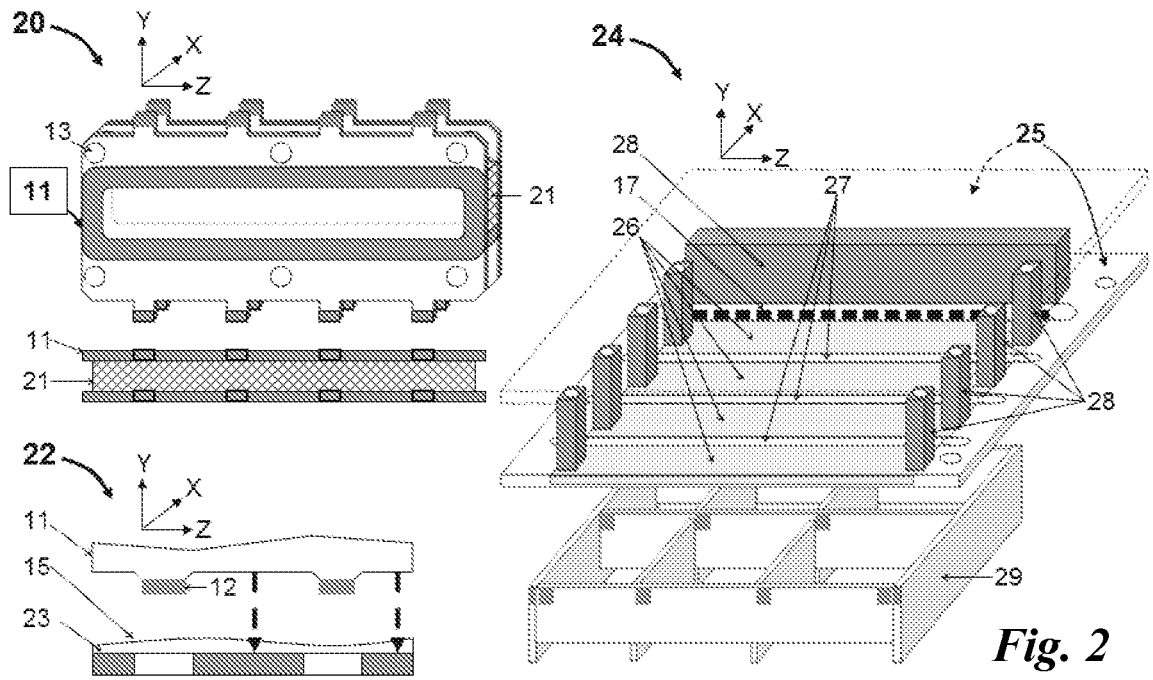
FIG. 2 shows another embodiment of the present invention of an ion mirror constructed of PCB boards and illustrates improvements of the mirror precision.

Referring to FIG. 2, embodiment 20 further improves the straightness and stiffness of individual mirror electrodes 11 before the step of entire mirror assembly by soldering of PCB or metal ridges 21 between a pair of electrodes 11. Parallelism of external surfaces of electrodes 11 and mutual alignment of windows 14 may be improved with technological jigs, e.g. referenced with aligning holes 13. Optionally, the same jig may be used for both the attachment of ridges and the assembly of the entire ion mirror.

Again referring to FIG. 2, yet another important step is proposed for improving the precision of electrode mounting, which is very likely to be affected by large variations of PCB thickness, specified to 5% of PCB thickness and rarely controlled at PCB manufacturing. Embodiment 22 illustrates the approach with exemplary milled slot 23 machined in PCB base plate 15 for precision of matching between bottom surface of base 15 and the edge of electrode 11. It is assumed that the bottom surface of PCB 15 is pressed against flat and hard surface at machining and then to rigid jig fixture or support 19 during assembly stage. Similar slots may be machined on ribs 12 for improved parallelism of electrodes 11.

Preferably, external edge and ribs 12 are milled simultaneously with internal window 14 to ensure their parallelism, specified at 0.1 mm in PCB industry, while typically being better. Yet preferably, simultaneously machined aligning holes 13 may serve for better alignment of the windows in the electrodes 11 windows.

Again referring to FIG. 2, another embodiment of PCB ion mirror 24 of the present invention comprises: a pair of parallel PCB plates 25, connected via side stands 28 and enforced by stiffing ribs 29; a compensating PCB 17 with multiple pads, interconnected by a not shown resistive chain; and an optional spacing electrode 28, which may also serve as a mirror cap. FIG. 2 shows the bottom half of ion mirror 24 in solid lines and upper plate 25 in dashed lines. Slits 27 are machined mutually parallel (at single installation) and aligned with not shown reference holes. Straightness and flatness of strips 26 is improved with PCB stiffing ribs 29, soldered at conductive pads, preferably on external side of ion mirror 24. Preferably, back side of PCB plate 25 has machined slots (similar to 23) for improved precision of ribs mounting, ensuring plate 25 straightness after the assembly.

Electrodes of ion mirror 24 are formed as follows. Plates 25 have multiple conductive coated strips 26, which are separated by slits 27 with partially conductive edges. To arrange electrical separation of adjacent electrodes, slits 27 are made partially conductive, for example by initially making fully conductive edges with PCB vias technology, and then disrupting the coating by making additional holes at far Z-edges of slits 27.

Without going into further details, the inventor claims that embodiment 24 also satisfies all measures of embodiment 20 for compensating deficiencies of standard PCB technology.

The inventor believes that prior art methods of making PCB ion optical components were missing most of those steps and could not provide precision, sufficient for ion mirrors.

It has been found that small misalignments of ion mirror electrodes in the ion reflecting region in fact produce a very substantial effect on tilting of ion packets time-fronts. The angular tilt of mirror electrodes is amplified by a factor of several tens due to ion post-acceleration in the flat part of the ion mirror. In the case of standard precision of PCB technology, the mirror tilt may reach a few mrad, which is expected to completely ruin MRTOF resolution, thus defeating the purpose of arranging multi-reflecting instruments.

Embodiments of the invention propose to arrange wedge electrostatic fields with diverging equipotential lines in the ion retarding region of electrostatic gridless ion mirrors of either MRTOF or E-traps for effective and electrically adjustable control over the ion packets time-front tilt angle γ.

Referring to FIG. 3, a model gridless ion mirror 30 according to an embodiment of the present invention is shown and comprises a wedge reflecting field 35 and a flat post-accelerating field 38. An ion packet 34 (formed with any pulsed converter or ion source) is initially aligned with the Z-axis, as shown by a line for the time-front. Ion packet 34 initially has a mean (average) ion energy $K_0$ and energy spread $\Delta K$. The ion packet 34 passes through field 38 and enters the wedge-shaped field 35 in the ion mirror at an inclination angle α (to the X-dimension). The ions are then reflected by the ion mirror (in the X-direction) and pass through the accelerating field 38.

Flat field 38 has equipotential lines arranged parallel to the Z-axis within potential boundaries corresponding to mean energies $K_0$ and $K_1$ of the ions, where $K_0 > K_1$. Model wedge field 35 may be arranged with uniformly diverging equipotential lines in the XZ-plane, where the field strength E(z) is independent on the X-coordinate, and within the ion passage Z-region the field E(z) is reverse proportional to the Z-coordinate: E(z)~1/z. Wedge field 35 starts at equipotential corresponding to $K=K_1$ and continues at least to the ion retarding equipotential 36 (K=0), tilted to Z-axis at $\lambda_0$ angle. This arrangement causes the time-front of the ion packet to be tilted by angle γ relative to the Z-axis, and the average trajectory of the ion packet (relative to the X-dimension) to be altered by steering angle ϕ.

While applying standard mathematics a non-expected and previously unknown result was arrived at: in ion mirror 30 with wedge field 35, the time-front tilt angle γ and the ion steering angle θ are controlled by the energy factor $K_0/K_1$ as:

$$\gamma = 4\lambda_0 * (K_0/K_1)^{0.5} = 4\lambda_0 * u_0/u_1$$

$$\phi = 4\lambda_0/3 * (K_1/K_0)^{0.5} = 4\lambda_0/3 * u_1/u_0$$

i.e. $\gamma/\phi = 3K_0/K_1 \gg 1$ where $K_1$ and $K_0$ are the mean ion kinetic energies at the exit of the wedge field 35 (index 1) and at the exit of flat field 38 (index 0) respectively, and $u_1$ and $u_0$ are the corresponding mean ion velocities. The angle ratio $\gamma/\phi = 3K_0/K_1$ may be practically reaching well over 10 or 30 and is controlled electronically.

At $K_0/K_1 = 1$ (i.e. without acceleration in the field 38), the wedge field already provides twice larger time-front tilt γ compared to fully tilted ion mirrors ($\gamma = 4\lambda_0$ Vs $\gamma = 2\lambda_0$), while producing a smaller steering angle ($\phi = 4/3\lambda_0$ Vs $\phi = 2\lambda_0$). The angles ratio $\gamma/\phi$ further grows with the energy factor as $K_0/K_1$ because the angles are transformed with ion acceleration in the field 38: both flight time difference dT and z-velocity w are preserved with the flat field 38, where the time-front tilt dT/u grows with ion velocity u and the steering angle dw/u drops with ion velocity u. By arranging larger $K_0/K_1$ ratio, the combination of wedge field with post-acceleration provides a convenient and powerful tool for adjustable steering of the time fronts of the ion packets, accompanied by negligibly minor steering of ion rays.

Again referring to FIG. 3, one embodiment 31 of ion mirror with amplifying reflecting wedge field comprises a regular structure of parallel mirror electrodes, all aligned in the Z-direction, where C denotes the cap electrode, and E1 denotes the first mirror frame electrode. Although only one mirror frame electrode E1 is shown, a plurality of such mirror frame electrodes may be provided stacked in the Z-direction (e.g. usually, from 4 to 8 electrodes). Mirror 31 further comprises a thin wedge electrode W, located between cap electrode C and first electrode E1. The wedge electrode W has a constant thickness in the X-direction and is aligned parallel with the Z-axis. However, as shown in the lower part of embodiment 31, the wedge electrode has a wedge-shaped (tapered) window in the YZ-plane for variable attenuation of the field due to cap electrode C potential. Such wedge window appears sufficient for minor curving of reflecting equipotential 36 in the XZ-plane, while having minor effect onto the structure and curvatures of the XY-field, which is important for ion optical quality of the ion mirror—high order (up to full 3rd order) isochronicity, up to 5th order time per energy focusing, spatial quality and low spatial aberrations.

A simulated ion optical model for a realistic ion mirror with wedge electrode W of embodiment 31 is illustrated by icons 32 and 33, where icon 32 shows the electrode structure (C, W and E1) around the ion reflection region and also shows equipotential lines in the XY-plane at one particular Z-coordinate. Icon 33 illustrates slight bending of retarding equipotential 36 in the XZ-middle plane at strong disproportional compression of the picture in the Z-direction, so that the slight curvature of the line 36 can be seen. Dark vertical strips in icon 33 correspond to ion trajectories, arranged at relative energy spread δ=0.05, so that angled tips illustrate the range of ion penetration into the mirror. Icon 33 shows that the wedge field 35 is spread in the Z-direction in the region for several ion reflections, which helps distributing the time-front tilting at yet smaller bend and smaller displacement of equipotential 36.

Simulations have confirmed that: (i) adjustments of the amplifying factor of $4(K_0/K_1)^{0.5}$ allows strong tilting of time-front at small wedge angles $\lambda_0$, thus not ruining the structure of electrical fields, which are optimized for reaching overall isochronicity and spatial focusing of ion packets; (ii) the time front tilt angle can be electronically adjusted from 0 to 6 degrees if using wedge W in both opposite ion mirrors; (iii) the compensation of the time-front tilting for deflectors is reached simultaneously with compensation of chromatic dependence of the Z-velocity, as illustrated in FIG. 10.

Referring to FIG. 4, yet another embodiment 40 of ion mirror with an amplifying wedge reflecting field is shown comprising conventional ion mirror electrodes (cap electrode C, first frame electrode E1, and optional further frame electrodes E2, etc) and further comprising a printed circuit board 41, placed between cap C and first mirror electrode E1. PCB 41 may either be composed of two aligned parallel PCB plates or may be one PCB with a constant size (z-independent) window, being a wider window than the one in the first frame electrode E1 to prevent the board 41 being charged by stray ions.

To produce a desired curvature or bend of the ion retarding equipotential 46, the PCB 41 carries multiple conductive pads, connected via surface mounted resistive chain 42, energized by several power supplies $U_1 \ldots U_j$ 43. Preferably, absolute voltages of supplies 43 are kept low, say under 1 kV, which is to be achieved at ion optical optimization of the mirror electrode structure. The net of resistors 42 and power supplies 43 allows adjusting the voltage distribution on PCB 41 flexibly and electronically, thus generating a desired tilt or curvature of retarding equipotential 46, either positive or negative, either weak or strong, either local or global, as illustrated by dashed lines 45. Flexible electronic control over tilt and curvature of the retarding line 46 is a strong advantage of the PCB wedge embodiment 40.

Again referring to FIG. 4, an exemplary embodiment 44 illustrates the case of mirror cap electrode C being unintentionally tilted by angle $\lambda_C$ to the Z-axis, this angle being expected to be a fraction of 1 mrad at realistic accuracy of mirror manufacturing. A printed circuit board 41 may be used for recovering the straightness of the reflecting equipotential 47, primarily designed for local compensation of the time-front tilting by unintentional mirror faults. Similarly, a second (opposing) ion mirror may have another PCB with a quadratic distribution of PCB potentials for electronically controlled correction of unintentional overall bend of ion mirror electrodes. Exemplary retarding equi-potentials 48 and 49 illustrate the ability of forming a compensating wedge or curvature.

Some practical aspects of using and tuning of PCB wedge are considered. Optionally, PCB electrodes 41 may be used at manufacturing tests only. The occurred inaccuracy of ion mirrors may be determined when measuring the required PCB compensation at recovered MRTOF resolution, which in turn could be used for calibrated mechanical adjustment of individual ion mirrors. Alternatively, the number of regulating power supplies 43 may be potentially reduced and the strategy of analyzer tuning may be optimized for constant use. It is expected that a pair of auxiliary power supplies may be used for simultaneous reaching of: creating preset wedge fields at far and near Z-edge, compensating electrodes faulty tilts, and compensating electrodes faulty bends. Indeed, all wedge fields may produce the same action—they tilt the time front of ion packets, and it is expected that a generic distribution of PCB potential may be pre-formed for each mirror, while controlling overall tilt and bow of wedge fields by a pair of low voltage power supplies 43.

Compared to wedge slit W in FIG. 3, PCB wedge mirrors 40 and 41 of FIG. 4 look more attractive for being more flexible. Adjusting potentials allows adjusting amplitude and sign of bend or tilt of the reflecting equipotential 46.

Figure 5:
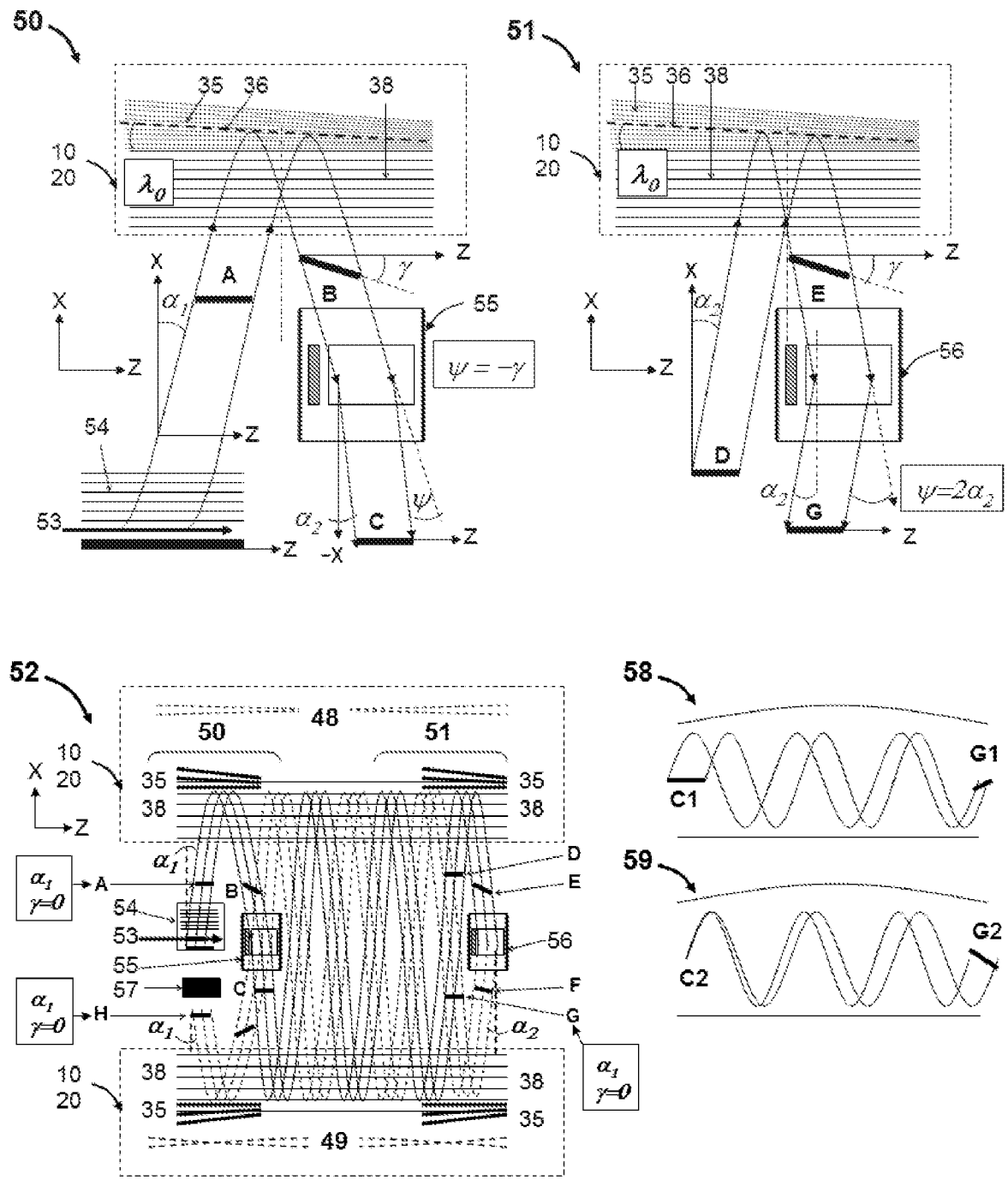
FIG. 5 illustrates the novel methods of compensated ion steering of embodiments of the present invention used for improved ion injection and for improved reversal of ion drift motion; the figure serves for explanation of local and global methods of compensating ion mirror imperfections, expected with standard PCB technology.

Referring to FIG. 5, there is shown an ion injection mechanism 50 into an electrostatic isochronous analyzer (either MRTOF MS or electrostatic trap), constructed with PCB ion mirrors 10 or 20. Following the annotations of FIG. 3, ion mirrors 10 or 20 are presented by two regions of electrostatic field: a "wedge" field 35 with diverging equipotential lines and a "flat" field 38 with parallel equipotential lines, wherein equipotential 36 is tilted to the Z axis by angle $\lambda_0$.

The ion injection mechanism 50 further comprises a compensated deflector 55, and an ion source (not shown) for generating a continuous ion beam 53 along the Z-axis; and an orthogonal accelerator 54 (OA), or any other pulsed source, aligned with the Z-axis.

In operation, ion beam 53 enters OA 54. Preferably, the ion beam energy is maintained above several tens of electron-Volts for improved injection of ion beam 53 and for lower angular divergence of ion packets A. When extraction pulses are applied, the orthogonal accelerator 54 emits ion packets A with zero tilt angle $\gamma=0$ of time front (i.e. ion packets are aligned with the Z-axis) and with ion rays being inclined by angle $\alpha_1$ to the X-direction, occurring due to conservation of the ion beam energy in the Z-direction. A relatively large inclination angle $\alpha_1$ (usually 4-5 degrees) helps the ions bypass the rims of the OA 54.

Usually, angles $\alpha_1$ are too large for dense folding of the ion trajectory within the MRTOF analyzers. To achieve denser trajectory folding at smaller inclination angles $\alpha_2$ of ion rays, embodiments of the invention propose to steer ion packets using ion deflector 55. After ion reflection within the wedge mirror field 35 and after post-acceleration in the flat field 38, the time-front B of the ion packet becomes tilted at angle $\gamma$ to the Z-direction (where $\gamma \gg \lambda_0$), as has been explained in relation to FIG. 3. Ion rays are then steered back in deflector 55 by angle $\psi = -\gamma$, so that the inclination angle $\alpha_2 = \alpha_1 - \psi$ is notably reduced, allowing for denser folding of ion rays in MRTOFs (for the purpose of higher resolution), while the orientation of the time-front C is recovered to $\gamma=0$, i.e. parallel to the Z-axis.

Preferably, deflector 55 (and deflector 56 in embodiment 51) comprises a pair of deflection plates and side plates set at a different potential (known as Matsuda plates in sectors) for generating an auxiliary quadrupolar field. The quadrupolar field compensates to first order the variations of the ion steering angle $\psi$, produced by ions slowing down in the region of higher deflection potential and removes the overfocusing effect of conventional deflectors. As a result, deflector 55 is capable of compensating for the angular dispersion of conventional deflectors, is capable of steering ion rays for the same angle $\psi$ independent on the Z-coordinate (i.e. focal distance $F \to \infty$), and tilts the time front by constant angle $\gamma=\psi$, i.e. keeps time fronts straight. Alternatively, deflector 55 is capable of controlling the focal distance F independent of the steering angle $\psi$, as described in a PCT co-pending application filed the same day as this application and entitled "ION INJECTION INTO MULTI-PASS MASS SPECTROMETERS" (claiming priority from GB 1712612.9 filed 6 Aug. 2017), the entire contents of which are incorporated herein. Alternatively, compensated deflectors may be trans-axial (TA) deflectors, formed by wedge electrodes, preferably using a second order correction, produced by an additional curvature of TA-wedge. For a narrower range of deflection angles, the compensated deflector may be arranged with a single potential while selecting the size of Matsuda plates or with a segment of toroidal sector, and ultimately may use a toroidal sector.

Again referring to FIG. 5, there is shown a method and a mechanism 51 of compensated back-end ion steering in MRTOFs with the use of wedge reflecting fields. The back end of PCB ion mirror 10 or 20 comprises a "flat" field 38, and a wedge reflecting field 35 with retarding equi-potential 36 tilted at an angle $\lambda_0$. Ion packets D (passed through the multi pass mass analyser MPTOF) arrive to the far Z-end of MPTOF after multiple reflections, where they traveled at an inclination angle $\alpha_2$ and with the time-front D being parallel to the Z-axis, i.e. at $\gamma=0$. After ion reflection in the mirror wedge field 35 and after post-acceleration in flat field 38, the time-front E of the ion packet becomes tilted by a relatively large (say, 3 deg) angle $\gamma=2\alpha_2$. Ion rays may be steered back by angle $\psi=-\gamma=2\alpha_2$ in a compensated deflector 56 (having the same for as deflector 55), so that the inclination angle becomes $-\alpha_2$, while orientation of the time-front G is recovered to $\gamma=0$. It has been discovered that the conditions for compensating the time front tilt and of the chromatic dependence of the Z-velocity in the combined system are achieved simultaneously. As a result, ion drift motion in the Z-direction is reverted without overall tilting of the time-front, which helps to achieve about twice denser folding of ion rays in an MRTOF or to arrange an isochronous ion trapping in electrostatic traps.

Again referring to FIG. 5, methods of compensating ion mirror misalignments are illustrated on the example of MRTOF mass spectrometer 52, incorporating both embodiments 50 and 51. In addition to wedge fields 35 incorporated at both Z-edges of PCB ion mirrors 10 or 20, one mirror may incorporate a global wedge field 48, and the other mirror may incorporate a global arc field 49, described in FIG. 4. Both global compensating fields 48 and 49 may be electronically adjustable in sign and amplitude. A number of compensation methods are possible in embodiment 52, as will be described in the following:

Local Compensation:

Let us assume that due to limited precision and flatness of PCB electrodes there occurs a wedge or arc field in the ion retarding region, so that it is expected to tilt the time fronts of ion packets, thus ruining the MRTOF isochronicity. Examples 58 and 59 illustrate effects of an unintentional "arc-shaped" reflecting equipotential on different components of ion packets C1 and C2. The initially parallel ion component C1 is focused at back end by deflector 55. It stays wide at the entrance end of ion mirrors, so the time front G1 is tilted counter-clock-wise. The initially diverging part C2 of ion packets diverges at the back end of the analyzer, so the time-front appears tilted clock-wise. Any global (i.e. integral within the entire analyzer) compensation would fail. However, the problem may be cured by correcting the arc field with an electronically controlled arc field 49, even if it is acting within the opposite mirror.

Similarly, the wedge unintentional field would introduce similar spread of time fronts G1 and G2 for ion trajectories passing back and forth, when using far-end reverting of the Z-motion with the deflector 56.

Thus, because of ion packets focusing and their natural divergence, local distortions and imperfections of ion mirror fields could be nearly fully compensated only with the local compensation, occurring within very few ion reflections.

Intermediate Scale Compensation:

An intermediate scale correction may be produced by a pair of deflectors 55 and 56, since deflector 55 is capable of correcting tilts of the G1 component and deflector 56 of the G2 component. In addition, the focusing strength of deflectors (corrected by Matsuda plate potentials) may be also used for correcting bends of time fronts. While corrections are mostly concerned with recovery of the time-front tilt, the by-product change of the trajectory inclination angle may be corrected by varying the ion beam injection energy. Thus, total correction may include an electronic adjustment of the ion beam 53 energy, deflection angles and focal distances of deflectors 55 and 56.

Global Compensation:

In addition to spread between G1 and G2 time-fronts, they may be both tilted systematically at various types of misalignments, such as a wedge field within one mirror or an inclined PCB mirror, an inclined accelerator or detector. The global correction may be produced either by a wedge field 48, an arc field 49, or with the use of intermediate scale correction, described just above.

Figure 6:
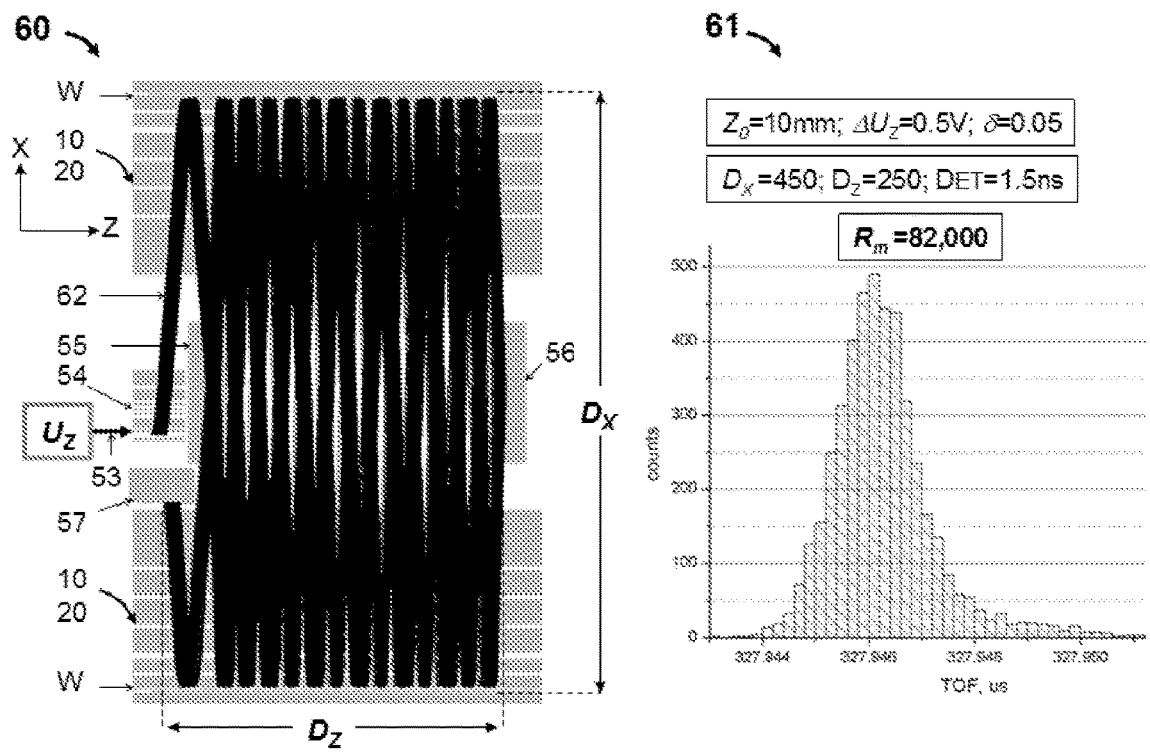
FIG. 6 shows results of ion optical simulations verifying improvements of FIG. 5.

Referring to FIG. 6, there are presented results of ion optical simulations of MRTOF 50 with compensated ion injection and with compensated reversal of ion trajectory in the Z-direction. The exemplary simulated compact MRTOF 50 comprises: parallel ion mirrors with cap-cap distance $D_X$=450 mm and useful length $D_Z$=250 mm, separated by a drift space at $U_X$=−8 kV acceleration voltage; an ion source generating an ion beam 53 along Z-axis at $U_Z$=57V specific energy with $\Delta U_Z$=0.5V spread; a straight orthogonal accelerator 54 OA aligned with the Z-axis; front and rear deflectors 55 and 56 with compensating Matsuda plates; a wedge electrode W at front and rear Z-end; and a detector 57 at front Z-end.

Example 60 illustrates ion rays at all accounted spreads of ion beam $Z_0$=10 mm long ion packets, $\Delta U_Z$=0.5V axial energy spread in the ion beam and $\delta=\Delta K/K$=5% energy spread of ion packets produced by 1.5 mm width of continuous ion beam 53. Though trajectories look filling most of the drift space, apparently, simulated ion losses are within 10%.

Example 61 presents the overall mass resolution $R_M$=83, 000 achieved in compact 450×250 mm analyzer while accounting all realistic spreads of ion beam and ion packets, so as DET=1.5 ns time spread. The outstanding performance and low level of analyzer aberrations prove the entire concept an confirms the claimed low TOF and spatial aberrations of MRTOF with the novel wedge ion mirror.

Yet higher resolutions are expected at larger size instruments, since the flight path L grows as product of instrument dimensions: $L=2D_X*D_Z/L_Z$, where $L_Z$ is the ion advance per reflection. Note that the dense packing became available with the novel mechanism of compensated ion injection of the present invention.

Figure 7:
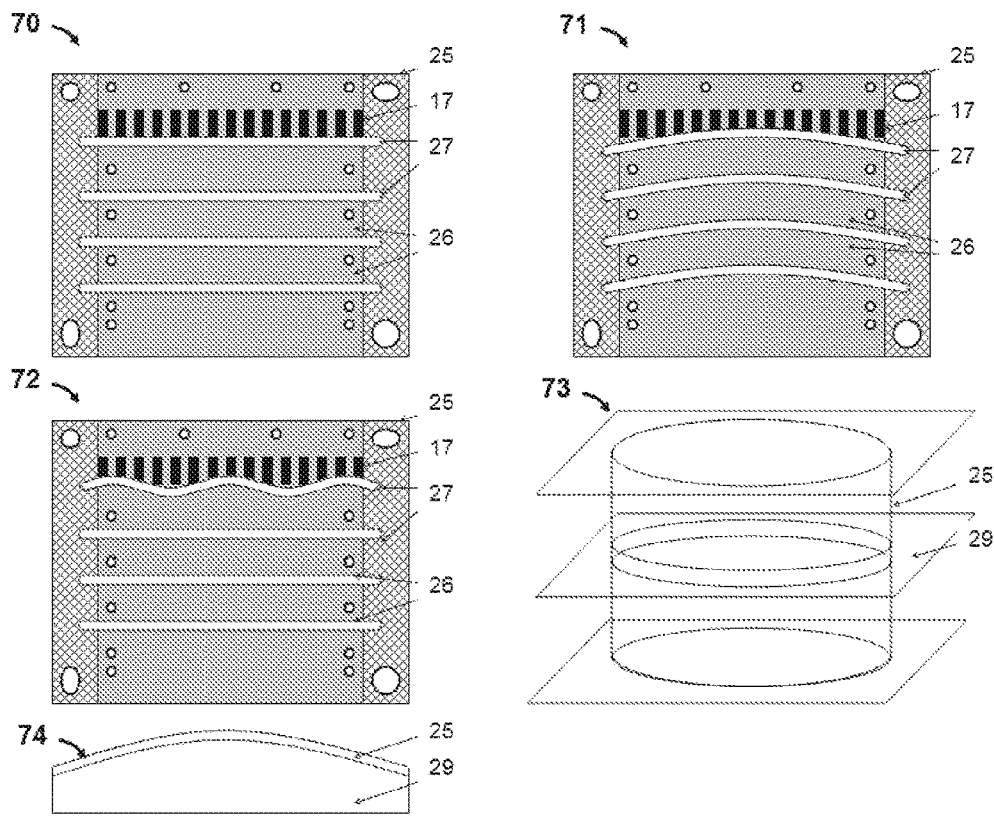
FIG. 7 illustrates various topologies achievable with PCB ion mirrors.

Referring to FIG. 7, the PCB technology is suitable for a wide variety of ion mirrors geometries and topologies. Example 70 is a copy of embodiment 24, where straight slots 27 and coatings 26 form a planar ion mirror with two-dimensional electric fields. Example 71 shows an example of curved fields produced by curved parallel slots. Example 72 shows an arrangement with quasi-planar fields, where curvature of slot 27 at ion retarding region is arranged to compensate for time front tilting within periodic lenses arranged in a drift space. Example 73 shows flexible board 25 wrapped into a cylinder where ribs 29 have circular opening for maintaining accurate circular shape of the board 25. Example 74 shows a bent board 25, with the bend being supported by machined ribs 29.

In the embodiments described herein (e.g. FIG. 1, FIG. 2 and FIG. 7), various expected imperfections of the PCB shape and expected moderate (of 0.1 mm scale) accuracy of slots 27 etc may be electrically compensated for and adjusted by wedge and/or arc fields in the ion retarding region of PCB ion mirrors. This may be arranged by energizing a resistive chain on the set of conductive pads 17, which renders the PCB technology suitable for high quality ion mirrors.

Although the present invention has been describing with reference to preferred embodiments, it will be apparent to those skilled in the art that various modifications in form and detail may be made without departing from the scope of the present invention as set forth in the accompanying claims.

The invention claimed is:

1. An ion mirror comprising:
   a plurality of electrodes and voltage supplies connected thereto that are configured to generate an electric field region that reflects ions in a first dimension (X-dimension),
      wherein at least a first compensating part of the electric field region through which ions travel in use has equipotential field lines that diverge, converge or curve as a function of position along a second, orthogonal dimension (Z-direction);
   at least one PCB having its plane arranged in the plane defined by the second dimension and a third dimension orthogonal to the first and second dimensions (Y-Z plane), said at least one PCB having at least one conductive strip thereon forming one of said plurality of electrodes; and
   a first base support arranged in the plane defined by the first and second dimensions (X-Z plane); and a second base support spaced apart from the first base support in the third dimension (Y-dimension), said second base support arranged in the plane defined by the first and second dimensions (X-Z plane); wherein said at least one PCB is arranged between the base supports and attached thereto.

2. The ion mirror of claim 1, wherein said compensating part of the electric field region is configured to tilt the time front of ions being reflected in the ion mirror.

3. The ion mirror claim 1, comprising a first PCB arranged in the plane defined by the-first and second dimensions (X-Z plane), said first PCB having at least one elongated conductive strip thereon that longitudinally extends in the second dimension, the conductive strip forming one of said plurality of electrodes.

4. The ion mirror of claim 3, wherein the first PCB comprises a plurality of said conductive strips spaced apart in the first dimension, wherein the plurality of conductive strips on the first PCB have been formed by providing said first PCB with a conductive surface and forming one or more elongated slits therein that extend in the second dimension so as to divide the conductive surface and define the conductive strips between the slits.

5. The ion mirror of claim 1, comprising at least one stiffening rib attached to the PCB for preventing the PCB from bending.

6. The ion mirror of claim 1, comprising electrodes arranged on opposing sides of the ion mirror in a third dimension (Y-dimension) that is orthogonal to the first and second dimensions, wherein the ion mirror comprises one or more voltage supply configured to apply different voltages to different ones of these electrodes for generating said equipotential field lines that diverge, converge or curve.

7. The ion mirror of claim 1, comprising a voltage supply and electrodes configured to apply a static electric field in an ion acceleration region adjacent, in a direction in which the ions are reflected, said compensating part of the electric field region; said ion acceleration region having parallel equipotential field lines for accelerating the ions out of the ion mirror.

8. The ion mirror of claim 1, wherein the ion mirror has a first length in the second dimension that comprises said compensating electric field region, and a second length in the second dimension that includes only parallel equipotential field lines for reflecting ions.

9. A mass spectrometer comprising:
   a time-of-flight mass analyser or electrostatic ion trap having at least one ion mirror as claimed in claim 1 and a pulsed ion accelerator for pulsing ion packets into the ion mirror.

10. The spectrometer of claim 9, comprising:
   a multi-pass time-of-flight mass analyser or electrostatic ion trap having at least one ion mirror as claimed in claim 1, and electrodes arranged and configured so as to provide an ion drift region that is elongated in a drift direction (z-dimension) and to reflect or turn ions multiple times in an oscillating dimension (x-dimension) that is orthogonal to the drift direction.

11. The spectrometer of claim 10, wherein:
   (i) the multi-pass time-of-flight mass analyser is a multi-reflecting time of flight mass analyser having two ion mirrors that are elongated in the drift direction (z-dimension) and configured to reflect ions multiple times in the oscillation dimension (x-dimension), wherein at least one of said two ion mirrors is an ion mirror according to claim 1; or
   (ii) the multi-pass time-of-flight mass analyser is a multi-turn time of flight mass analyser having an ion mirror according to claim 1 and at least one electric sector configured to reflect and turn ions multiple times in the oscillation dimension (x-dimension).

12. The spectrometer of claim 10, comprising an ion deflector configured to back-steer the average ion trajectory of the ions, in the drift direction, thereby tilting the angle of the time front of the ions; and wherein said compensating electric field region is configured to tilt the time front of the ions passing therethrough so as to at least partially counter-act a tilting of the time front by the ion deflector.

13. A method of mass spectrometry comprising:
   providing an ion mirror as claimed in claim 1;
   applying voltages to electrodes of the ion mirror so as to generate said electric field region having equipotential field lines that diverge, converge or curve as a function of position along the second dimension (Z-direction); and
   reflecting ions in the ion mirror in the first dimension (X-dimension).

14. The method of claim 13, wherein the ion mirror comprises electrodes arranged on opposing sides of the ion mirror in a third dimension (Y-dimension) orthogonal to the first and second dimensions, and the method comprises: applying different voltages to different ones of these electrodes so as to generate said equipotential field lines that diverge, converge or curve; and adjusting the voltage supplies as a function of time so as to vary the voltages applied to the electrodes and the divergence, convergence or curvature of said equipotential field lines.

15. An ion mirror comprising:
a plurality of electrodes and voltage supplies connected thereto that are configured to generate an electric field region that reflects ions in a first dimension (X-dimension),
wherein at least a first compensating part of the electric field region through which ions travel in use has equipotential field lines that diverge, converge or curve as a function of position along a second, orthogonal dimension (Z-direction); and
least one PCB having its plane arranged in the plane defined by the second dimension and a third dimension orthogonal to the first and second dimensions (Y-Z plane), said at least one PCB having at least one conductive strip thereon forming one of said plurality of electrodes.

16. The ion mirror of claim 15, comprising a window in the PCB for allowing ions to travel therethrough, in use, wherein the conductive strip surrounds said window.

17. The ion mirror of claim 15, comprising electrodes arranged on opposing sides of the ion mirror in the third dimension (Y-dimension), wherein the ion mirror comprises one or more voltage supply configured to apply different voltages to different ones of these electrodes for generating said equipotential field lines that diverge, converge or curve.

18. A mass spectrometer comprising a time-of-flight mass analyzer having at least one ion mirror as claimed in claim 15 and either (i) a pulsed ion accelerator for pulsing ion packets into the at least one ion mirror; or (ii) a detector arranged such that ions are reflected by the ion mirror onto the detector.

19. A mass spectrometer comprising a time-of-flight mass analyzer having: an ion mirror as claimed in claim 15; and further comprising an ion mirror that comprises a plurality of electrodes and voltage supplies connected thereto that are configured to generate an electric field region that reflects ions in the first dimension (X-dimension), and at least one PCB having its plane arranged in the plane orthogonal to the first dimension, said at least one PCB having at least one conductive strip thereon forming one of said plurality of electrodes.

20. Within a multi-reflecting electrostatic analyzer, an ion mirror
comprising:
(a) a set of electrodes, formed by conductive surfaces on at least one printed circuit board;
(b) said at least one board is constructed either of ceramics or of epoxy based materials with glass filling;
(c) a set of slits in said board for isolating said electrodes;
(d) partial metal coatings on the edges of said slits;
(e) at least one rib, orthogonally attached to said at least one board for stiffness and straightness of said board; and
(f) at least one compensating electrode placed within ion retarding region of said ion mirror for arranging wedge and/or arc curvature of the ion retarding field for compensating intrinsic inaccuracy and flexing of said at least one board.

* * * * *